(12) United States Patent
Williamson et al.

(10) Patent No.: US 6,615,387 B1
(45) Date of Patent: Sep. 2, 2003

(54) METHOD AND APPARATUS FOR ERROR DETECTION

(75) Inventors: Clifton James Williamson, Soquel, CA (US); Schweiray Joseph Lee, Santa Cruz, CA (US); Venkata Raja Gosula, Santa Cruz, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/401,148

(22) Filed: Sep. 22, 1999

Related U.S. Application Data
(60) Provisional application No. 60/101,357, filed on Sep. 22, 1998.

(51) Int. Cl.[7] .............................................. H03M 13/00
(52) U.S. Cl. ..................... 714/785; 714/784; 714/758
(58) Field of Search ................................. 714/766, 755, 714/756–758, 784–785, 761, 804, 769, 764, 8, 763, 782, 746, 52, 752; 708/492, 530; 360/48, 49, 53; 365/189.02, 189.08, 230.06, 239; 710/20, 5; 712/208, 245

(56) References Cited

U.S. PATENT DOCUMENTS

| | | | |
|---|---|---|---|
| 4,162,480 A | | 7/1979 | Berlekamp ................... 714/784 |
| 4,566,105 A | * | 1/1986 | Oisel et al. .................. 714/756 |
| 5,099,482 A | | 3/1992 | Cameron ..................... 714/784 |
| 5,107,503 A | * | 4/1992 | Riggle et al. ................ 714/784 |
| 5,182,752 A | * | 1/1993 | DeRoo et al. ............... 714/758 |
| 5,241,546 A | * | 8/1993 | Peterson et al. ............. 714/761 |
| 5,329,534 A | | 7/1994 | Cucchi et al. ............... 714/784 |
| 5,371,751 A | * | 12/1994 | Moriyama ................... 714/762 |
| 5,373,511 A | | 12/1994 | Veksler ........................ 714/755 |
| 5,422,895 A | | 6/1995 | Nguyen et al. .............. 714/756 |
| 5,442,578 A | | 8/1995 | Hattori ........................ 708/492 |
| 5,444,719 A | | 8/1995 | Cox et al. .................... 714/769 |
| 5,446,745 A | | 8/1995 | Gibbs .......................... 714/758 |
| 5,615,220 A | * | 3/1997 | Pharris ........................ 714/785 |
| 5,745,508 A | * | 4/1998 | Prohofsky .................... 714/766 |
| 5,805,799 A | * | 9/1998 | Fredrickson et al. .......... 714/52 |
| 5,812,564 A | * | 9/1998 | Bonke et al. ................ 714/769 |

OTHER PUBLICATIONS

Redinbo, G.R. (Generalized algorithm–based fault tolerance: error correction via Kalman Estimation; IEEE, On pp. 639–655, Jun. 1998).*

* cited by examiner

*Primary Examiner*—Albert Decady
*Assistant Examiner*—Guy Lamarre
(74) *Attorney, Agent, or Firm*—David K. Lucente; Derek J. Berger

(57) ABSTRACT

An error correction and miscorrection detection apparatus includes a memory buffer for storing user data contained in a data signal. A syndrome computer circuit generates a plurality of EDC syndromes form an EDC codeword. The EDC codeword includes user data encoded with a plurality of m-bit EDC parity symbols. The EDC codeword is encoded with plurality of n-bit ECC parity symbols to form the data signal, such that m>n. An ECC error correction circuit corrects the user data with an error signal generated for each corruption of the data signal. A completion is signal generated once correction of the EDC codeword is complete. A syndrome fix-up circuit is configured to adjust the EDC syndromes based on the received error signals. Once the completion signal is received, a miscorrection by the ECC error correction circuit is detected if a value of the adjusted syndromes is not equal to zero.

26 Claims, 23 Drawing Sheets

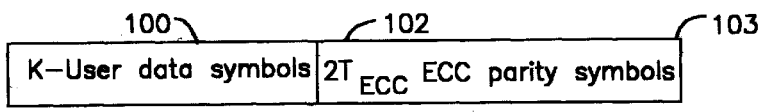
FIG. 1
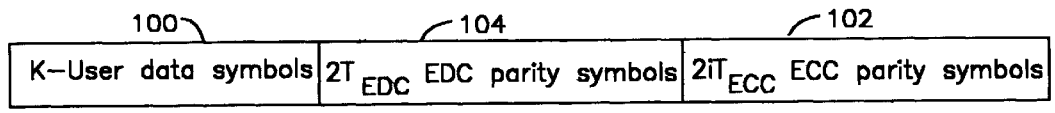
FIG. 2
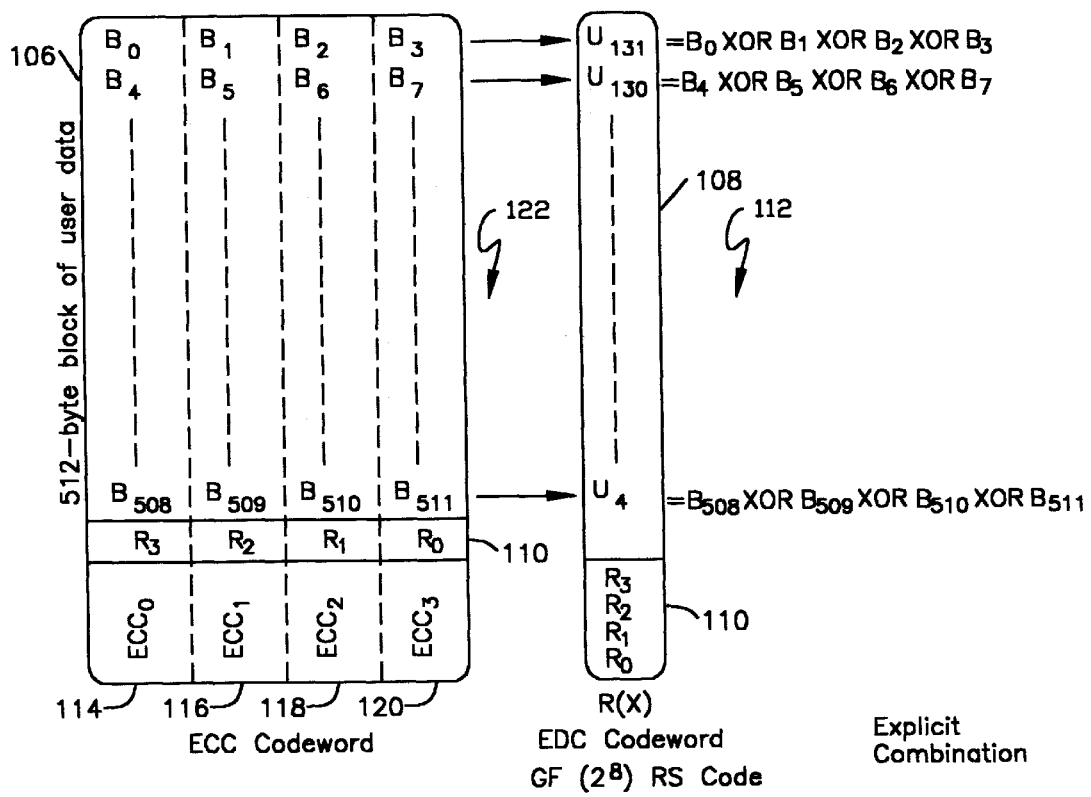
FIG. 3
FIG. 4

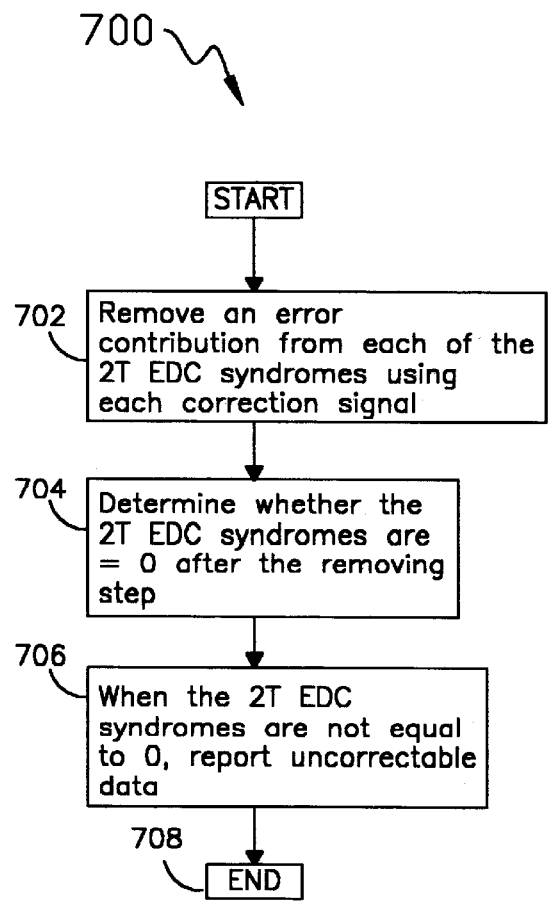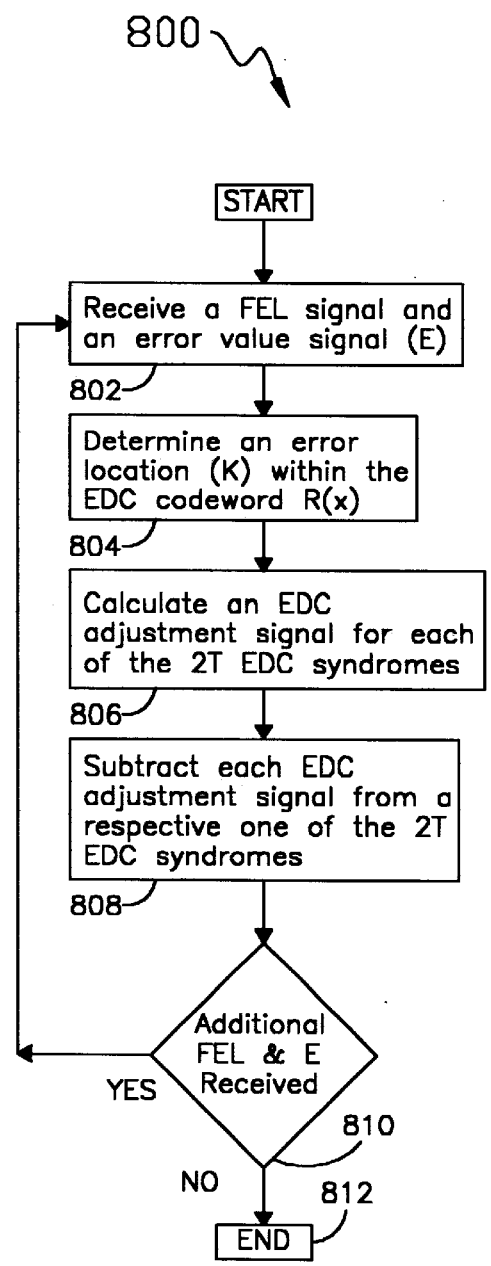
FIG. 25
FIG. 26

METHOD AND APPARATUS FOR ERROR DETECTION

CROSS REFERENCE TO RELATED APPLICATIONS

This invention claims the benefit of U.S. Provisional Patent application Ser. No. 60/101,357; filed Sep. 22, 1998.

FIELD OF THE INVENTION

The present invention relates generally to an error correction apparatus and method. In particular, the invention relates to an apparatus and method for detecting miscorrections of data read from a storage medium using Linear Block Code encoding and decoding as an error detection code (EDC).

BACKGROUND

A storage medium is subject to various types of noise, distortion, and interference; various errors can occur at the output of the storage medium. This is particularly true for rotating magnetic media based storage systems and media, such as hard magnetic disc drives. The current trend is to store greater amounts of digital data in smaller areas on the storage medium. This trend increases the probability of errors. To detect errors and correct the detected errors, error correction coding (ECC) is used. To verify that the corrections made by the ECC are valid, an EDC is used.

Error correction coding typically consists of at least an "encoding algorithm" and a "decoding algorithm". For example, if systematic encoding is used, the encoding algorithm takes a block of k data symbols and computes r parity symbols which are appended to the data symbols to form a block of data. For any given code, the number r is fixed and the number k must be less than a fixed bound.

The block of data consisting of data symbols and parity symbols is referred to as a "codeword". However, a codeword written to the storage medium can be corrupted during read-back from the storage medium. Consequently, the decoding algorithm takes the codeword, which may or may not be corrupted, as input and then determines if errors have occurred and, if so, attempts to correct those errors. The decoding algorithm can correct up to T errors, where T is a fixed constant depending on the code and related to the number of parity symbols used to construct the codeword. Typically, the decoding algorithm computes symbols called "syndromes", which are determined from the (possibly corrupted) data and parity symbols read from the storage medium. As a result of the codeword design, if all bits in all the syndromes are 0, the data read constitutes a valid codeword. Otherwise, errors are detected and the syndromes are used as the inputs to the error correction algorithm.

Linear Block Codes (LBC) are a very broad class of codes that are useful for error correction. Details concerning LBCs are apparent to those skilled in the art of error control systems and are therefore set forth briefly for a proper understanding of the invention. Generally, source data is segmented into blocks of k m-bit data or message symbols; each block can represent one of $2^{mk}$ distinct messages. An encoder then transforms the blocks of k data/message symbols into larger blocks of n symbols. The encoder essentially adds r=(n−k) parity symbols to the k data/message symbols. The collection of all such blocks of length n is a linear (n, k) block code because its $2^{mk}$ codewords form a k-dimensional subspace of the vector space of all the n-tuples over a Galois Field (GF) of order $2^m$ ($GF(2^m)$).

Consequently, it is possible to define a generator matrix as well as a parity check matrix. Encoding of the source data to generate a codeword, using non-systematic encoding, is accomplished by multiplying the k data/message symbols by the generator matrix. Decoding occurs by multiplying a received codeword by the parity check matrix to generate syndromes. If the syndromes equal zero, the received codeword is valid and the k data/message symbols are, with high probability, uncorrupted (i.e., the received codeword is the original codeword).

One typical and frequently employed class of LBC error correcting codes (ECC) are Reed-Solomon (RS) codes. For a $T_{ECC}$-error correcting RS code, $2T_{ECC}$ ECC parity symbols 102, such that $r=2T_{ECC}$, are appended to each block of k m-bit user data symbols 102 to create a codeword 103, as depicted in FIG. 1. There are $k+2T_{ECC}$ symbols in a RS codeword. The RS code views each m-bit user data symbol as an element of $GF(2^m)$. A GF is a finite field, the elements of which may be represented as polynomials in alpha ($\alpha$), where $\alpha$ is a root of an irreducible polynomial of degree m. Table 1 depicts a subset of irreducible polynomials of degree m. The RS codeword consists of a block of m-bit symbols. Constructing the $GF(2^m)$ requires defining an irreducible polynomial P(x) of degree m. In addition, a primitive element beta $\beta$ is chosen so that every nonzero element of $GF(2^m)$ is a power of $\beta$. The element $\beta$ is not necessarily a root of P(x).

TABLE I

Exemplary Subset of Irreducible Primitive Polynomials of Degree m

| m | | m | |
|---|---|---|---|
| 3 | $1 + X + X^3$ | 14 | $1 + X + X^6 + X^{10} + X^{14}$ |
| 4 | $1 + X + X^4$ | 15 | $1 + X + X^{15}$ |
| 5 | $1 + X^2 + X^5$ | 16 | $1 + X + X^3 + X^{12} + X^{16}$ |
| 6 | $1 + X + X^6$ | 17 | $1 + X^3 + X^{17}$ |
| 7 | $1 + X^3 + X^7$ | 18 | $1 + X^7 + X^{18}$ |
| 8 | $1 + X^2 + X^3 + X^4 + X^8$ | 19 | $1 + X + X^2 + X^5 + X^{19}$ |
| 9 | $1 + X^4 + X^9$ | 20 | $1 + X^3 + X^{20}$ |
| 10 | $1 + X^3 + X^{10}$ | 21 | $1 + X^2 + X^{21}$ |
| 11 | $1 + X^2 + X^{11}$ | 22 | $1 + X + X^{22}$ |
| 12 | $1 + X + X^4 + X^6 + X^{12}$ | 23 | $1 + X^5 + X^{23}$ |
| 13 | $1 + X + X^3 + X^4 + X^{13}$ | 24 | $1 + X + X^2 + X^7 + X^{24}$ |

A RS codeword is viewed as a codeword polynomial (C(x)) and the redundancy symbols are chosen so that the roots of C(x) include the roots of a generator polynomial G(x) whose roots are 2T consecutive powers of $\beta$ beginning with $\beta^{m0}$, such that $G(x)=(x-\beta^{m0+1}) \ldots (x-\beta^{m0+2T-1})$ and m0 is an arbitrary integer. The k user data symbols are viewed as the high order coefficients of a degree k+2T−1 polynomial (U(x)), and the redundancy symbols are the coefficients of the remainder (B(x)) when the polynomial U(x) is divided by G(x) such that B(x)=U(x) modulo G(x), and C(x)=U(x)−B(x).

Once the codeword C(x) is formed, C(x) is generally written to a data storage medium. The process of corrupting the original codeword C(x) generally occurs during read back from the storage medium where a received polynomial R(x) is returned. However, if the received polynomial R(x) is not corrupted, R(x) is equal to C(x), the codeword polynomial before being written to the storage media.

However, errors often occur in bursts rather than in random patterns, so that several consecutive bytes or symbols are in error. Since the correction code's capacity is limited to 2T errors, error bursts will often exceed the code's capacity. For example, errors in such a burst are confined to a single codeword, the error correction coding technique cannot correct these errors.

Interleaving the user data is often used to overcome this deficiency respective of burst errors. Interleaving involves partitioning a block of data into smaller sub-blocks called interleaves and independently computing parity for each of the interleaves. Interleaving provides two principal advantages: (a) error bursts are distributed over several codewords; and (b) larger blocks of data can be encoded.

The ability to encode larger blocks of data with interleaving is vital when dealing with binary data. Binary data is partitioned into sub-blocks referred to as symbols. Typically, the symbols consist of 8 bits and are called bytes. Yet, the codeword size for RS codes of binary data is limited to $2^m-1$ symbols, where m is the number of bits per symbol. If a RS code uses byte symbols, the number k of data symbols is bounded by $255-2T_{ECC}$. However, a typical block size for user data in a byte based system is often a 512-byte sector of data read from a storage medium. Unfortunately, 512-bytes cannot be encoded with a $GF(2^8)$ RS code unless interleaving is used.

However, the use of interleaving does not eliminate the possibility of undetected corruption of user data. One possibility occurs when the data is corrupted in such a way as to form a different codeword. Another, and more likely possibility occurs when the number of errors exceeds the correction power of the code and the correction algorithm returns another valid codeword. This is referred to as a miscorrection. In other words, miscorrection refers to a situation where the decoding algorithm cannot recognize that its error correction capability is exceeded and returns a valid, yet incorrect, codeword.

To reduce the probability of a miscorrection, an additional code called an error detection code (EDC) is used. Here EDC parity symbols are computed and appended to user data. For the purposes of ECC encoding, the user data together with the EDC parity symbols are viewed as "data symbols", so that ECC parity is computed based on both user data and EDC parity, as depicted in FIG. 2. As FIG. 2 shows, for FIG. 1: $k \leq 255-2T_{ECC}$ and FIG. 2: k is typically 512; the same k-user data symbols 100 as in FIG. 1, we now employ $2T_{EDC}$ EDC parity symbols 104 in addition to the 2i $T_{ECC}$ ECC parity symbols 102, where i is a natural number representing the number of interleaves into which the user data and EDC parity were partitioned.

One can use a RS code with byte symbols as an EDC. On read-back, both EDC syndromes (i.e., syndromes based on the EDC codeword formed by the user data and EDC parity) and ECC syndromes (i.e., syndromes based on the ECC codeword formed by the user data, EDC parity, and ECC parity) are computed.

However, RS codewords using byte symbols must have 255 or fewer data bytes. Thus, with a block of 512 user data bytes, the user data bytes must be implicitly or explicitly combined in order to meet the restriction on the number of data bytes. FIGS. 3 and 4 depict one possible way of explicitly combining a 512-byte user data block 106 to enable representation of the user data block with a $GF(2^8)$ RS EDC code. As depicted FIG. 3, the 512-byte user data block 106 is represented by bytes $B_0, B_1, \ldots B^{511}$, separated into four columns, as shown. As depicted in FIG. 4, the data bytes to be encoded by the EDC might be 128 bytes such that $U_{131}=B_0$ XOR $B_1$ XOR $B_2$ XOR $B_3, \ldots, U_4=(B_{508}$ XOR $B_{509}$ XOR $B_{510}$ XOR $B_{511})$ as shown in FIG. 4, where XOR refers to the exclusive-OR operation performed across the four columns of the 512-byte user data block 106 for a given row. For a T=2 EDC, parity bytes $Q_0, Q_1, Q_2,$ and $Q_3$ would be constructed as the "EDC codeword polynomial" 112 C(x), such that $C(x)=U_{131}*x_{131}+ \ldots +U_4*x^4+Q_3*x^3+ \ldots Q_0$. ECC parity ($ECC_0, ECC_1, ECC_2, ECC_3$) is then computed from the 516 bytes $B_0, \ldots B_{511}, R_3, \ldots, R_0$ using four interleaves as depicted in FIG. 3 to form an ECC codeword 122 for each interleave. In other words, the data encoded by C(x) is formed by performing an XOR across the four interleaves of the ECC codeword 122 for each row of user data 106.

Unfortunately, the explicit combination technique described above fails when identical miscorrections occur in two interleaves. Erasure flagging is a technique of marking certain bytes as suspect. For example, when a thermal asperity (TA) is detected by the read channel in a hard disk drive, the data read during the TA are considered suspect and can be flagged as erasures. In addition, erasure flagging can increase the likelihood of such identical miscorrections. The ability to flag suspected bad data can often double the error correction capability of a RS code. For example, if e is the number of erasures flagged and v is the number of other errors, we can correct the e erasures and v errors so long as $2v+e \leq 2T$. As such, if no other error occurs, such that v=0, the error correction capability is doubled. However, the use of erasure flagging reduces the error detection capability of a RS code as e approaches 2T. Although the probability of identical miscorrections in two interleaves is very unlikely, the probability of miscorrection cancellation dramatically increases when erasure flags are used as a result of the explicit combination described above.

Therefore, there remains a need for a technique that provides the benefits of miscorrection detection and eliminates the possibility of error cancellation of the EDC described above. Moreover, the EDC should not be limited by a user data block size of 512 bytes.

SUMMARY

The present invention overcomes the problems associated with the above system by disclosing a method and apparatus that utilizes a Linear Block Code with m-bit symbols with m>8, for example a RS code defined over $GF(2^m)$, as an EDC as part of an error correction and miscorrection detection system. The LBC must allow codewords longer than 255 symbols, thereby avoiding the XORing that was necessary with a RS code over GF(256). For example, a RS code with 10-bit symbols allows codewords with $1023=2^{10}-1$ which easily accommodates the 512-byte data sectors commonly used in the computer industry. The present invention allows such a code to be used in an error correction system using a byte-based ECC. The EDC codeword is used to verify the ECC, such that when the ECC corrects errors in the data, the ECC corrections are used to adjust the EDC syndromes computed from the corrupted EDC codeword to determine if the ECC has made a miscorrection. More generally, the invention allows an EDC with m-bit symbols to be used with an ECC with n-bit symbols where m>n.

In accordance with one embodiment of the invention, a method for error correction and miscorrection detection in a data transmission is disclosed in which a data signal is received. The data signal is comprised of an EDC codeword which is further encoded with a plurality of n-bit error correction code (ECC) parity symbols; the EDC codeword is comprised of user data encoded with a plurality of m-bit EDC parity symbols, such that $m \geq n$. A plurality of EDC syndromes are calculated from the EDC codeword. A correction signal consisting of an error location and an error value is received for each correction of the data. Each correction signal is then used to adjust the EDC syndromes. A miscorrection is detected if the value of the adjusted EDC syndromes is not equal to zero once all corrections are applied.

In accordance with another embodiment of the invention, an apparatus and system implementing the inventive methods is disclosed. An error correction and miscorrection detection in data transmission apparatus includes a memory buffer for storing user data contained within the data signal. A syndrome computer circuit is configured to receive the EDC codeword and compute EDC syndrome signals. An ECC error correction circuit is configured to receive the data signal and correct the user data contained in the memory buffer using a correction signal generated for each detection of a data corruption of the data signal. A completion signal is generated once correction of the user data is complete. An EDC syndrome fix-up circuit is configured to receive the EDC syndrome signals, each of the correction signals and the completion signal. The EDC syndrome signals are adjusted in response to each received error signal. A miscorrection is detected if a value of the adjusted EDC syndromes signals is not equal to zero once the completion signal is received.

Advantages of the invention include the ability to detect miscorrections by the ECC without having to explicitly combine the user data to form the EDC codeword. This results in a system in which $2^m-1$ or more symbols per codeword are possible; for example, 1023 bytes, thereby eliminating the problem of error cancellation associated with the above systems for m=10. In addition, the EDC codewords can be constructed in a byte-based system with the addition of minimal hardware elements.

BRIEF DESCRIPTION OF THE DRAWINGS

Additional advantages of the invention will become apparent upon reading the following detailed description and upon reference to the drawings, in which:

FIG. 1 depicts a block of user data encoded with $2T_{ECC}$ parity symbols;

FIG. 2 depicts a block of user data encoded with $2T_{EDC}$ parity symbols and $2iT_{ECC}$ parity symbols;

FIG. 3 depicts a 512-byte block of user data and 4-EDC parity symbols encoded with ECC parity symbols using 4-interleaves;

FIG. 4 depicts an EDC codeword R(x) created by computing an XOR across the 4-ECC interleaves for each row of the 512-byte block of user data and computing 4-parity symbols, $R_3$ through $R_0$ using a $GF(2^8)$ RS code;

FIG. 25 is a flow chart depicting methods steps for removing an error contribution from each of the $2T_{EDC}$ EDC syndrome signals according to an embodiment of the invention;

FIG. 26 is a flow chart depicting methods steps for forming an EDC error signal according to an embodiment of the invention;

DETAILED DESCRIPTION

Mathematical Overview

Figure 5:
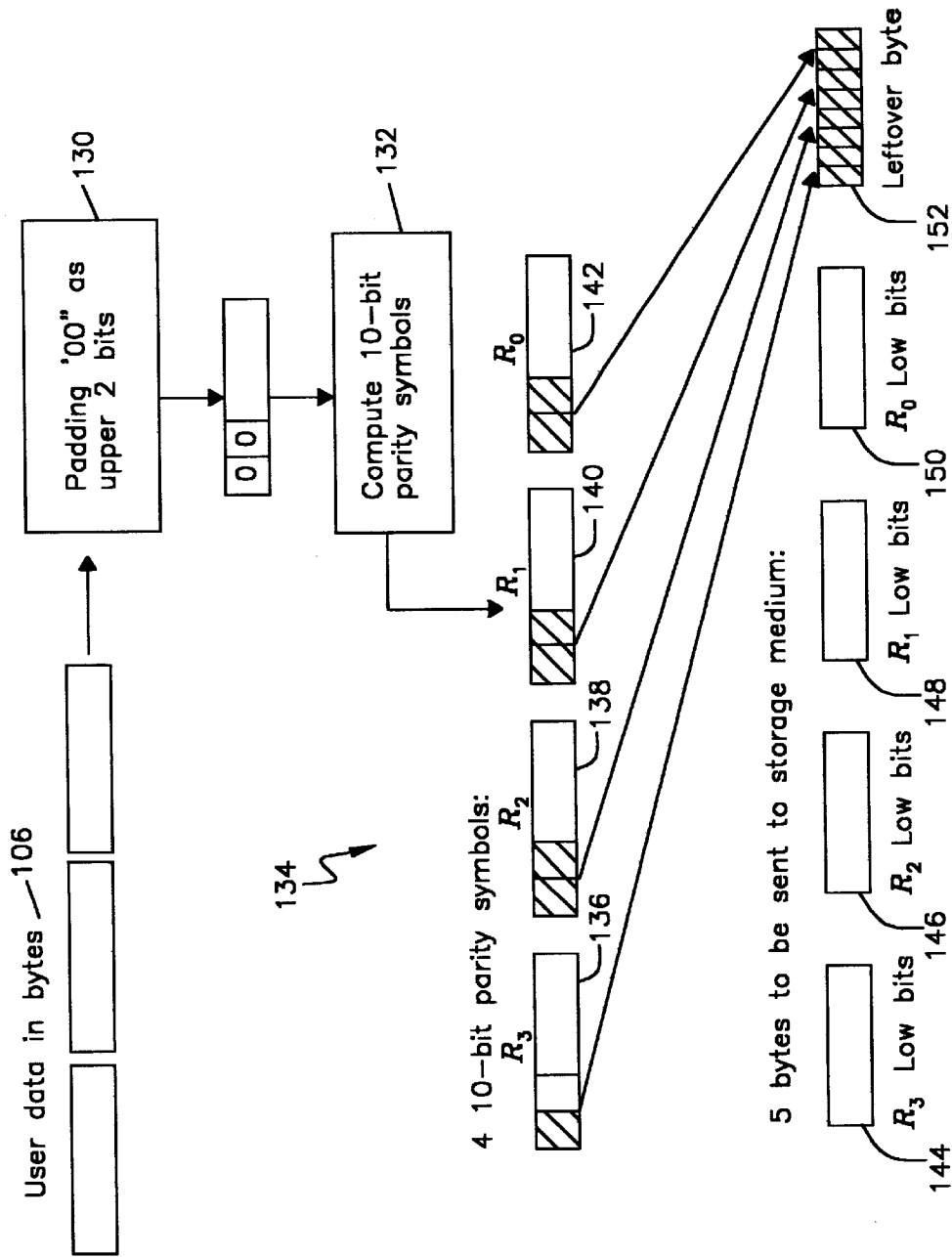
FIG. 5 depicts EDC encoding according to an embodiment of the invention.

We first describe some theoretical and mathematical underpinning for the inventive technique so that the invention can be more readily understood in the context of standard mathematical notation in the field.

Although the present invention is described with reference to Reed Solomon (RS) codes and Galois Fields (GF) order of $2^{10}$ ($GF(2^{10})$), it will be appreciated by one of ordinary skill in the art that such details are disclosed simply to provide a more thorough understanding of the present invention and the present invention may be practiced without these specific details. Namely, RS codes are specific subclass of the more generic Linear Block Codes (LBC), as previously described. LBCs include but are not limited to cyclic codes, BCH codes and RS codes. It is within the contemplation of the present invention to practice the invention with an EDC code falling generally within the class of LBCs without departing from the scope of the invention. Moreover, the teaching of the present invention are not limited to $GF(2^{10})$. The invention may be practices with $GF(2^m)$ where $m \leq$ or $\geq 10$ without departing from the scope of the invention.

$GF(2^{10})$ Reed-Solomon Code

We chose a primitive element $\alpha = b + (\alpha^4 + \alpha)$ as a fixed primitive element of $GF(2^{10})$, such that $\alpha^5 + \alpha^2 + 1 = 0$ is an irreducible polynomial over $GF(2)$, and $b^2 + b + 1 = 0$ defines an extension field $GF(2^{10})$ of $GF(2^5)$. Note, $\alpha^5 + \alpha^2 + 1$ defines an extension field $GF(2^5)$ of $GF(2)$. It can be verified that the 1023 powers of the primitive element $\alpha$, namely $1 = \alpha^0$, $\alpha = \alpha^1$, $\alpha^2$, ..., $\alpha_{1022}$, are distinct elements of $GF(2^{10})$. Moreover, the use of extension fields allows multiplication on GF(1024) to be defined in terms of multiplication on GF(32). Linear Block Codes, Galois fields and extension fields are described in "Error control systems for digital communication and storage" by Stephen B. Wicker published 1995 by Prentice Hall, Inc., Englewood cliffs, N.J. 07632, ISBN 0-13-200 809-2.

Once the primitive element is defined, the powers of the primitive element $\alpha$ are $\alpha^1$, $\alpha^2$, $\alpha^3$, ... $\alpha^{2T_{EDC}}$, etc. Thus, a block of data is an error detection code (EDC) codeword for $T_{EDC}=2$ error correction capability if the codeword polynomial $(C(x))$ satisfies $C(\alpha) = C(\alpha^2) = C(\alpha^3) = \ldots = C(\alpha^{2T_{EDC}}) = 0$, or more generally $C(\alpha^{m0}) = C(\alpha^{m0+1}) = C(\alpha^{m0+2}) = \ldots = C(\alpha^{m0+2T-1})$. Evaluating $C(x)$ at $2T_{EDC}$ consecutive powers of $\alpha$ is known as syndrome computation, such that the syndromes associated with a codeword all equal zero. Consequently, if the syndromes generated from a received EDC codeword $R(x)$ do not equal zero, a data corruption has occurred and an error in the EDC codeword is detected. Otherwise the EDC codeword $R(x)$ forms a valid codeword, which with high probability is equal to the original codeword $C(x)$.

$GF(2^{10})$ EDC Encoding

From a mathematical point of view, Reed-Solomon codes over $GF(2^{10})$ treat data as sequences of 10-bit symbols. However, most digital data storage systems are byte-oriented (i.e., data is represented in the form of 8-bit symbols called bytes or antipole multiples of 8-bit bytes). This invention modifies the encoding and decoding algorithms in order to efficiently implement Reed-Solomon codes over $GF(2^{10})$ or in byte-oriented systems. The details concerning the encoding of the user data will be apparent to those skilled in the art of error control systems and are therefore not set forth herein except as needed for a proper understanding of the invention. Although the invention is described with reference to $GF(2^{10})$, it will be apparent to those skilled in the art of error control system that EDC encoding with $GF(2^m)$, where $m > 8$ is within the scope of the invention.

A systematic Reed-Solomon encoder takes user data as input and computes parity symbols which, along with the user data, are used to form a codeword that is then written to a storage medium. In a byte-oriented system, the user data is fed to the encoder in the form of 8-bit symbols (byte format). In an embodiment of the current invention, the encoder converts these 8-bit user data symbols (user data bytes) to a 10-bit format as the 8 least significant bits (LSB) of a 10-bit symbol with the 2 most significant bits (MSB) set to zero. The encoder then computes the 10-bit parity symbols from the user data in a 10-bit format such that the 2 MSB of the 10-bit parity symbols are not necessarily zeros. Before the user data in 10-bit format and the 10-bit parity symbols are sent to the storage medium, they need to be converted to byte-format. The user data was originally sent to the encoder in byte format. Therefore the user data bytes can be stored on the storage medium without any processing. However, since the 2 MSB of the (10-bit) parity symbols are not necessarily zero, all 10-bits of each parity symbol must be stored on the medium.

FIG. 5 depicts the EDC encoding of user data 106 with a $T_{EDC}=2$ Reed-Solomon code, such that there are 4 10-bit parity symbols 134. The 4 parity symbols 134 contain a total of 40 bits derived from the 10-bits per parity symbol, which are written to the medium as 5 8-bit bytes. The preferred embodiment of the current invention first sends the 8 LSB of each parity symbol to the storage media and keeps the 2 MSB of each parity symbol in a register in the encoder. The 8 LSBs of a parity symbol will be referred to as a "partial parity symbol". After the 8 LSB of all 4 10-bit parity symbols 134 are written to the storage media (32 bits), the register contains the 2 MSB of all 4 parity symbols 134 (8-bits), forming a 5th parity-byte 152. The encoder then writes the 5th parity-byte 152 to the storage media. In the preferred embodiment of the current invention, this final or fifth parity byte is referred to as the "leftover byte" 152.

$GF(2^{10})$ EDC Decoding

We first describe some conventional aspects of $GF(2^{10})$ EDC decoding so that certain inventive modifications provided for 10-bit EDC syndromes are more readily understood. It is once again emphasized that $GF(2^{10})$ is used as an example to clarify the inventive techniques of the present invention.

The Reed-Solomon decoder takes a received codeword $R(x)$ (which may or may not have been corrupted) read from the storage medium as input, and computes "syndromes". The syndromes will determine whether or not $R(x)$ is a valid codeword. The computation of syndromes is now briefly described: suppose the codeword length is $(k+r)$ symbols consisting of $k$ user data symbols and $r=2T_{EDC}$ parity symbols. The sequence of $(k+r)$ symbols entering the decoder can be represented by a polynomial of degree $(k+r-1)$ with the coefficients being the symbols and the powers of the variable indexing the order of the symbols entering the decoder. If we use the highest power of the variable to index the first symbol, the receive codeword polynomial $R(x)$ can be written as follows:

$$R(x) = q_{k+r-1} x^{(k+r-1)} + q_{k+r-2} x^{(k+r-2)} + \ldots + q_r x^r + q_{r-1} x^{r-1} + \ldots + q_1 x + q_0$$

where $\{q_{k+r-1}, \ldots, q_r\}$ are the (possibly corrupted) data symbols, and $\{q_{r-1}, \ldots, q_0\}$ are the (possibly corrupted) parity symbols, The syndromes of this particular sequence are computed by evaluating the polynomial at $\{\alpha^j\}$, $J=1, \ldots, r$; where $\{\alpha^j\}$, $J=1, \ldots, r$ are the $r=2T_{EDC}$ roots of the generator polynomial. Therefore, $r$ syndromes can be computed:

$$S_j = R(\alpha^j) = q_{k+r-1}(\alpha^j)^{(k+r-1)} + q_{k+r-2}*(\alpha^j)^{(k+r-2)} + + q_1(\alpha^j) + q_0, \text{ where } J=1, \ldots, 2T_{EDC} \text{ or}$$

$J = m_0, m_0+1, \ldots, m_0+2T_{EDC}-1$

Figure 6:
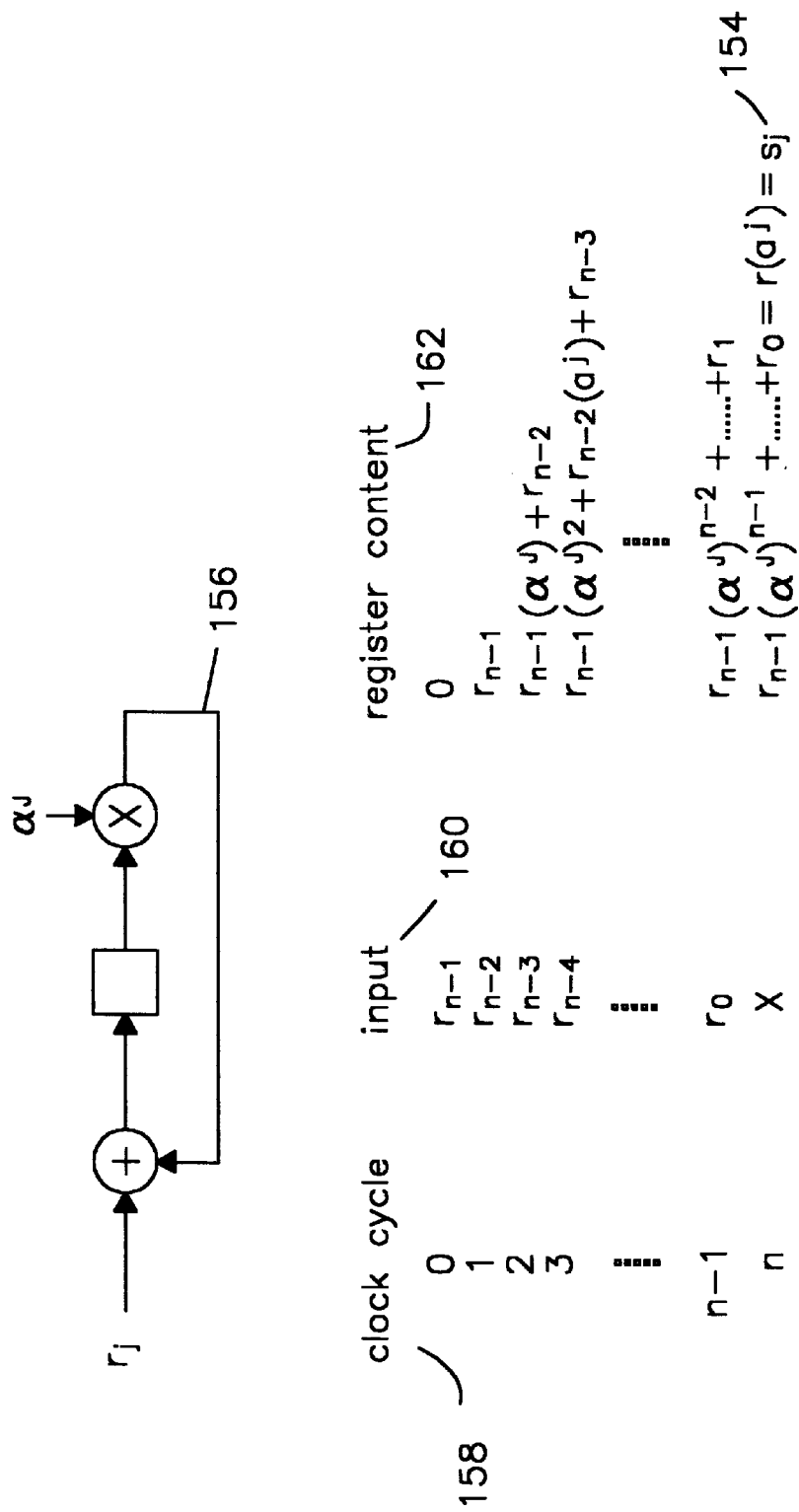
FIG. 6 depicts syndrome generation hardware according to an embodiment of the invention.

FIG. 6 depicts a syndrome machine 156 that computes the Jth syndrome 154 using Horner's algorithm as known in the art. The 10-bit symbols of the received EDC codeword $R(x)$ are received one at a time. The register 157 is initialized to 0 and as each clock cycle 158 passes, the contents of the register 157 are multiplied by $\alpha^j$, the coefficient 160 of $R(x)$ is added to the result of the multiplication, and the resulting sum is stored in the register 157. This process continues until the final coefficient $r_0$ has been received. To implement a RS syndrome computer, 2T of the Horner's machines are placed in parallel to simultaneously receive the bytes of R(x) and computed the 2T syndromes in parallel.

Embodiments of the current invention modify the above described syndrome computation algorithm in order to compute 10-bit syndromes using 8-bit symbols as input. The following notation is introduced: Let H be a 10-bit symbol. ($H_9$, $H_8$, $H_7$, ..., $H_0$) Define:

1) hi(H) to be the 10-bit symbol whose 8 LSBs are all zero and whose 2 MSB are the same as the 2 MSB of H so that hi(H)=($H_9$, $H_8$, 0, 0, ..., 0)

2) lo(H) to be the 10-bit symbol whose 2 MSBs are both zero and whose 8 LSB are the same as the 8 LSB of H so that lo(H) (0, 0, $H_7$, $H_6$ ..., $H_0$)

Then, any 10-bit symbol H can be represented as the bit-wise sum (i.e., bitwise XOR) of hi(H) and lo(H) such that H=hi(H)+lo(H). In Reed-Solomon codes over $GF(2^{10})$ with T=2, every codeword has 4 (or 2T) 10-bit parity symbols. Define two polynomials, a first user data polynomial and a second parity polynomial, to represent the (possibly corrupted) sequence of user data and parity symbols as follows:

The user data polynomial: $U(x)=U_{k+3}x^{(k+3)}+ \ldots +U_4x^4$

The parity polynomial: $Q(x)=Q_3x^3+Q_2x^2+Q_1x+Q_0$ where $\{U_i\}$ and $\{Q_i\}$ are 10-bit symbols. The parity polynomial can be written as The parity polynomial.

$$Q(x) = Q_3x^3 + Q_2x^2 + Q_1x + Q_0$$
$$= (hi(Q_3)+lo(Q_3))x^3 + \ldots + (hi(Q_1)+lo(Q_1))x +$$
$$(hi(Q_0)+lo(Q_0))$$
$$= [hi(Q_3)x^3 + hi(Q_2)x^2 + hi(Q_1)*x + hi(Q_0)] +$$
$$[lo(Q_3)x^3 + lo(Q_2)x^2 + lo(Q_1)x + lo(Q_0)]$$
$$= H(x) + L(x),$$

Since the coefficients of H(x) (resp. L(x)) are the high (resp. low) bits of the coefficients of Q(x), we may write H(x)=hi(Q(x)) and L(x)=lo(Q(x)).

In the current invention, the encoder computes the parity polynomial Q(x) using U(x) and then sends the user data U(x) and partial parity symbols L(x) to the storage medium, disregarding the 2 MSB of all coefficients. In the meantime, the "leftover byte" is constructed with the 2 MSB of all 4 coefficients of H(x). This byte is then sent to the medium after the last symbol of L(x). Therefore, the codeword stored in the medium can be represented as:

$$R(x) = U(x) + Q(x)$$
$$= U(x) + L(x) + H(x)$$

And the computation of syndromes can be written as:

$$S_j = R(\alpha^j)$$
$$= U(\alpha^j) + L(\alpha^j) + H(\alpha^j) \quad J = 1, \ldots, 4$$

Based on the encoding algorithm in the preferred embodiment of the current invention, the k bytes of user data are directly stored to the medium in byte format, although they are used as the 8 LSB of the k 10-bit symbols in the encoding process. Also, the 8 LSB of every 10-bit parity symbol (i.e., the partial parity symbols) are represented as coefficients values of L(x). When these k bytes of user data and r bytes of partial parity symbols (which may have been corrupted) are read out of the medium and fed into the decoder, they are again treated as the LSB of 10-bit symbols with the 2 MSB padded with zeros. Therefore, $U(\alpha^j)+L(\alpha^j)$ can be computed by simply feeding these k 10-bit $\{U\}$ symbols followed by the r $\{L\}$ symbols to the syndrome computer described above.

Figure 7:
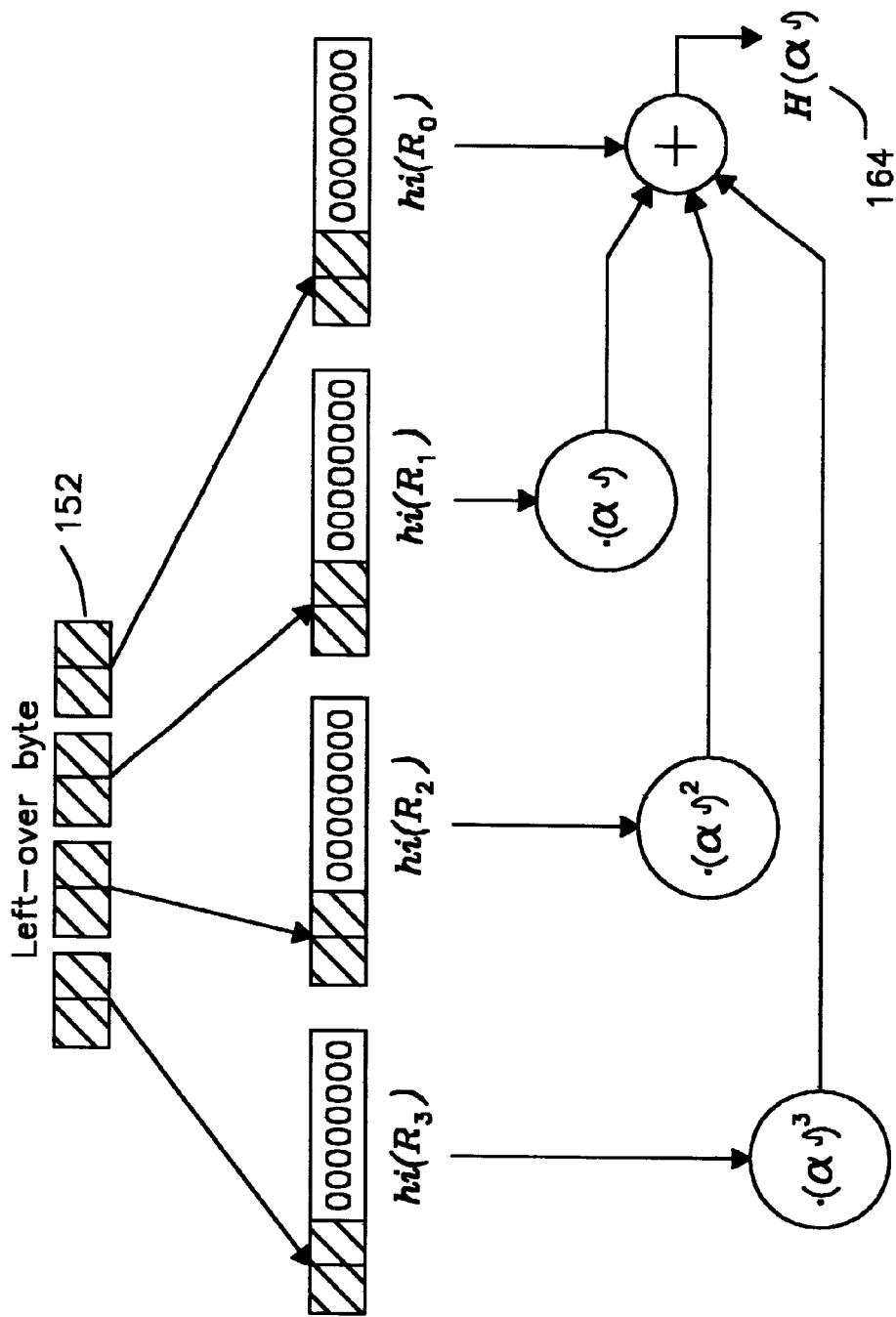
FIG. 7 depicts syndrome computing from a leftover-byte according to an embodiment of the invention.

Finally, $H(\alpha^j)$ needs to be computed using the "leftover byte" to complete the syndrome computation. This requires special purpose "leftover logic". When the leftover byte is read out of the medium, the decoder distributes the bits of this byte into the 2 MSB of the four 10-bit elements $\{H\}$, and $H(\alpha^j)$ can be computed, as depicted in FIG. 7. The 2 MSB 151 as shown are contained within the leftover and padded with 8-zeros as the LSB to form $hi(Q_3)$, $hi(Q_2)$, $hi(Q_1)$ and $hi(Q_0)$. Once computed, $hi(Q_3)$ is multiplied by $\alpha^{3J}$, $hi(Q_2)$ is multiplied by $\alpha^{2J}$, $hi(Q_1)$ is multiplied by $\alpha^J$ and summed together along with $hi(Q_0)$ to from $H(\alpha^J)$. Consequently, the Jth syndrome can be obtained simply by adding $H(\alpha^J)$ to $U(\alpha^J)+L(\alpha^J)$.

Miscorrection Detection for $GF(2^{10})$

The EDC syndromes computed from a corrupted data signal are "fixed up" every time an error correction to the data signal is made. The details concerning the correction of the data signal will be apparent to those skilled in the art of error control systems and are therefore not set forth herein except as needed for a proper understanding of the invention. However, error correction of the data signal may be performed as described in U.S. Pat. No. 5,905,740 or by the prior art methods disclosed therein. Suppose that the data and parity are represented by the EDC codeword polynomial:

$$C(x)=U_{515}*x^{(515)}+ \ldots +U_4x^4+hi(Q_3)x^3+hi(Q_2)x^2+hi(Q_1)x+hi(Q_0)+lo(Q_3)x^3+lo(Q_2)x^2+lo(Q_1)x+lo(Q_0)$$

If there are 512 bytes of user data $B_0$, $B_1$, ... $B_{511}$, then it follows that the high coefficient is C(x), $U_{515}=B_0$, the next coefficient $U_{514}=B_1$ and so forth until $U_4=B_{511}$. Suppose that byte $B_0$ is corrupted so that the first byte read is $(B_0+e)$ where e is an error value as described previously. Then the polynomial read from the storage medium is the received polynomial $R(x)=C(x)+e \ x^{515}$.

Hence, the four EDC syndromes for T=2 are:

$$R(\alpha) = C(\alpha) + e\alpha^{515} = 0 + e\alpha^{515} = e\alpha^{515},$$
$$R(\alpha^2) = C(\alpha^2) + e(\alpha^2)^{515} = 0 + e\alpha^{(515*2)} = e\alpha^{(515*2)},$$
$$R(\alpha^3) = C(\alpha^3) + e(\alpha^3)^{515} = 0 + e\alpha^{(515*3)} = e\alpha^{(515*3)}, \text{ and}$$
$$R(\alpha^4) = C(\alpha^4) + e(\alpha^4)^{515} = 0 + e\alpha^{(515*4)} = e\alpha^{(515*4)},$$

The first syndrome is "fixed up" by subtracting $e \ \alpha^{515}$ from it. This removes the "contribution" from the error in $B_0$. The second syndrome is fixed up by subtracting $e\alpha^{(515*2)}$ to it. The third syndrome is fixed up by subtracting $e\alpha^{(515*3)}$ and finally, the fourth syndrome is fixed up by subtracting $e\alpha^{(515*4)}$ to it. Where there is more than one error, fix-ups are applied for each error. After all errors have been processed, the fixed-up EDC syndromes should now be zero as the "contribution" from every error should now be removed. If not, a miscorrection is detected.

A special fix-up must be applied when an error e occurs in the leftover byte. Suppose the bits of the error e are $e_7, e_6, \ldots, e_0$. When the error e occurs in the leftover byte, the polynomial read from the storage medium is:

$$R(x) = C(x) + (e_7 e_6 00000000)x^3 + (e_5 e_4 00000000)x^2 +$$
$$(e_3 e_2 00000000)x + (e_1 e_0 00000000)$$
$$= C(x) + E(x).$$

Thus, the fix-up for the first syndrome is $E(\alpha)$, the fix-up for the second syndrome is $E(\alpha^2)$, for the third $E(\alpha^3)$ and for the nth $E(\alpha^n)$.

From the mathematical description it will be clear to those having ordinary skill in the art that an EDC code can be designed to detect miscorrection by an ECC code, such that the EDC code allows larger block sizes without interleaving. Specifically, a LBC can be used to encode user data with r m-bit EDC parity symbols to from an EDC codeword R(x). R(x) is then interleaved, with each interleave encoded with a plurality of n-bit ECC parity symbols. In the case of Reed-Solomon codes, as long as m is sufficiently larger than n, the EDC can accommodate larger block sizes without the interleaving required by the ECC. In general, the EDC must be chosen to allow such a larger block size without interleaving. Moreover, syndrome computation is possible so long as the EDC obeys the following rules for syndrome computation: Let B be a block consisting of M=m-bit symbols and let $S_i(B)$, $i=m_0, \ldots, m_0+2t-1$, be the 2t syndromes associated with B. Then if $B=B_1 \oplus B_2$, where & denotes bitwise XOR, then the teachings of the present invention apply as long as $S_i(B)=S_i(B_1) \oplus S_i(B_2)$. In the present invention, Bi consists of the n LSBs of the symbols in B with the (m−n) MSBs all zero and $B_2$ consists of the (m−n) MSBs of the symbols in B with the n LSBs all zero. The number of leftover symbols is:

$$\left\lceil \frac{2T*(m-n)}{n} \right\rceil$$

(Note: if the quotient is not an integer, we round up to the next interger.)

System Architecture

The following system architecture is described with reference to various polynomial representations of data. For example, C(x) is generally used as notation to represent an error detection code (EDC) codeword before it is written to a storage media, such that user data encoded with EDC parity symbols are represented as the coefficients of C(x). When the EDC codeword C(x) is read back from the storage medium, it becomes a received EDC codeword R(x). If the received EDC R(x) is uncorrupted, R(x) equals (=) C(x). Otherwise, R(x) is corrupted, such that R(x) is not equal to (≠) C(x).

To simplify the explanation of syndrome computation in a byte based system (n=8), from symbols in excess of eight-bit bytes (m=10), the following notation is adopted. Assuming the coefficients of R(x) are comprised of user data and parity symbols in excess of 8-bit bytes (m greater than (>) 8), a LSB EDC codeword polynomial L(x) is generally a partial polynomial representation of R(x) such that the coefficients of L(x) are comprised of the eight LSBs of the coefficients of R(x) padded with zeros in the MSBs. A MSB EDC codeword polynomial H(x) is a partial polynomial representation of R(x) such that the coefficients of H(x) are comprised of the two MSBs of the coefficients of R(x) with the remaining LSBs of the coefficients of H(x) padded with zeros in the LSBs. Without the byte-based limitation of many systems, the syndromes of R(x) could simply be computed by evaluating R(x) at $2T_{EDC}$ consecutive powers of the primitive root $\alpha$, $R(\alpha^j)$ for $j=1, 2, \ldots 2T_{EDC}$ or more generally for $J=m_0, m_0+1, \ldots M_0+2T_{EDC}-1$, wherein $T_{EDC}$ is a natural number representing an error correcting capability of the EDC used and $m_0$ is an arbitrary integer. However, due to the byte-based system limitation, syndromes are computed from a Jth MSB EDC syndrome signal $H(\alpha^j)$ and a Jth LSB EDC syndrome signal $L(\alpha^j)$ for J=1, 2..., $2T_{EDC}$, such that $H(\alpha^j)+L(\alpha^j)=R(\alpha^j)$ for J=1, 2, ..., $2T_{EDC}$.

The present invention relates generally to an error correction apparatus. In particular, the invention relates to an apparatus and method for correcting and detecting miscorrections of data read from a storage medium using m-bit Linear Block Code (LBC) encoding and decoding as an error detection code (EDC), where m is greater than (>) 8.

An exemplary embodiment is described with reference to FIG. 8. An embodiment of an error correction and miscorrection detection in data transmission apparatus 200 is depicted. The apparatus 200 includes a memory buffer 202 for storing user data contained with a data signal 220. The data signal 220 is comprised of an error detection code (EDC) codeword polynomial R(X) 222 encoded with a plurality of n-bit error correction code (ECC) parity symbols. R(X) 222 is comprised of user data encoded with r m-bit EDC parity symbols 226 using the LBC, and the r m-bit EDC parity symbols are comprised of $2T_{EDC}$ n-bit partial parity symbols and at least one n-bit leftover symbol(s) such that m>n. For example, as in FIG. 10, the r m-bit EDC parity symbols 226 can be generated as $2T_{EDC}$ 10-bit EDC parity symbols using a Galois Field of order ($GF(2^{10})$) Reed Solomon code, such that m=10 and $r=2T_{EDC}$. However for an ECC using 8-bit byte parity symbols (n=8), the 10-bit EDC parity symbols are formatted as $2T_{EDC}$ partial parity symbols and at least one leftover byte(s). Table II depicts the EDC codeword R(x) for m=10, n=8 and $r=2T_{EDC}$ for $T_{EDC}=2$. As described herein, system encoding is a coding technique where the user data are unmodified and become part of the codeword along with the parity symbols.

TABLE II

Exemplary Structure of EDC Codeword - R(x)

| | Leftover Byte |
|---|---|
| User Data in Bytes | 5 Bytes Parity Representation |

A syndrome computer circuit 204 is coupled to the data signal 220. The syndrome computer circuit 204 is configured to receive the EDC codeword R(x) 222 and compute $2T_{EDC}$ least significant bit (LSB) EDC syndrome signals from the user data and the $2T_{EDC}$ n-bit partial parity symbols and $2T_{EDC}$ most significant bit (MSB) EDC syndrome signals from the n-bit leftover-symbol(s) that are combined to form $2T_{EDC}$ EDC syndrome signals 240.

An ECC error correction circuit 208 is coupled to a memory buffer 202 and is configured to receive the data signal 220 and correct the user data 224 contained within the data signal 220. The ECC error correction circuit will generate an error signal for each data corruption detected from the EDC codeword 222. The error signal is comprised of a forward error location (FEL) signal 242 and a corresponding error value (EV) signal 244. The FEL is generated by finding the roots of an error locator polynomial. The EV is generated by evaluating an error evaluator polynomial at the roots of the error locator polynomial. The FEL signals 242 and the EV signals 244 are used to correct the user data 224 contained within the memory buffer 202. A completion signal 246 is generated by the ECC error correction circuit 208 once all of the data corruptions of the EDC codeword 222 are detected and the user data 224 is corrected. The memory buffer 202 is implemented, for example, as dynamic random access memory (DRAM).

An EDC syndrome fix-up circuit 210 is coupled to the syndrome computer circuit 204 and the ECC error correction circuit 208 and is configured to receive the $2T_{EDC}$ EDC. syndromes signals 240, each FEL signal 242 and each EV signal 244 generated by the ECC error correction circuit 208 and the completion signal 246 once correction of the user data 224 is complete. The EDC syndrome fix-up circuit 210 uses each FEL signal 242 and each EV signal received to adjust the $2T_{EDC}$ EDC syndrome signals 240. The EDC syndrome signals are adjusted by generating and removing an EDC error contribution signal from each of the $2T_{EDC}$ EDC syndrome signals 240 using the FEL signal 242 and the EV signal 244 received for each data corruption detected by the ECC error correction circuit 208. Once the completion signal 246 generated by the ECC error correction circuit 208 is received by the EDC syndrome fix-up circuit 210, a miscorrection by the ECC error correction circuit 208 is detected if one or more values of the adjusted $2T_{EDC}$ EDC syndrome signals 240 are not equal to zero.

Figure 9:
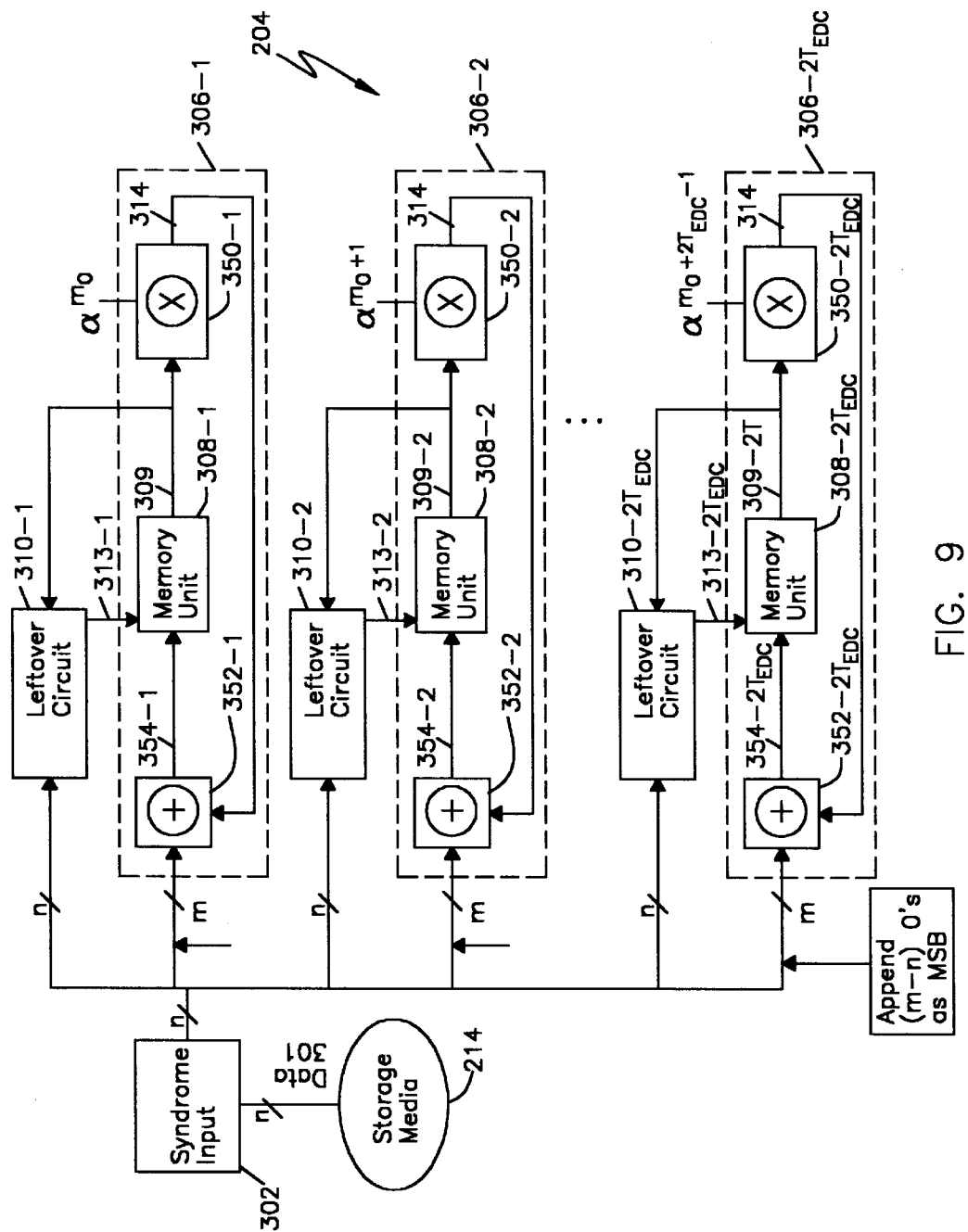
FIG. 9 depicts a syndrome computer circuit according to an embodiment of the invention.

In accordance with another embodiment of the invention depicted in FIG. 9, the syndrome computer circuit 204 is comprised of a syndrome input 302 configured to receive data 301 comprised of the EDC codeword R(X). $2T_{EDC}$ syndrome generator circuits 306 (e.g., 306-1, 306-2, ..., 306-2T) are configured to receive the data 301 in parallel from the syndrome input 302 and compute the $2T_{EDC}$ LSB EDC syndromes signals from the EDC codeword. The user data and the appended $2T_{EDC}$ n-bit partial parity-symbols are generally represented as coefficients of a polynomial L(X), wherein the $2T_{EDC}$ n-bit partial parity-symbols are comprised of an n-LSBs of each of the $2T_{EDC}$ m-bit EDC parity symbols.

The 2T syndrome generator circuits 306 each include a memory unit 308 (e.g., 308-1, 308-2, ..., 308-$2T_{EDC}$) for storing each of the $2T_{EDC}$ EDC syndrome signals computed from L(x). 2T root multipliers 350, are each coupled to one of the memory units 308 (e.g., 350-1, 350-2, ..., 350-$2T_{EDC}$) and are configured to multiply a Jth power of a primitive root α ($α^J$) by a value 309 contained within the memory unit 308 (R) to produce a product $R*α^J$ 314. The primitive root 60 is an element of a Galois Field (GF) of order $2^m$ (GF($2^m$)) and the J varies between $m_0$ and $m_0+2T_{EDC}-1$ and is distinct for each of $2T_{EDC}$ root multipliers 350, where $m_0$ is an arbitrary. $2T_{EDC}$ Galois field (GF) adders 352 are each coupled to one of the $2T_{EDC}$ root multipliers 350 and the syndrome input 302 (Galois field addition is bitwise XOR). The $2T_{EDC}$ GF adders 352 are configured to add the data 301 received from the syndrome input 302 to the product $R*α^J$ 314 to produce a sum output 354. The sum output 354 is stored in the memory unit 308 such that during a decoding stage and after the user data and the $2T_{EDC}$ n-bit partial parity symbols are received, a Jth LSB EDC syndrome signal L($α^J$) is stored in the memory unit 308 to form the $2T_{DEC}$ LSB EDC syndrome signals. As previously described L(x) is an EDC codeword polynomial representation of the user data and $2T_{EDC}$ n-bit partial parity symbols as it coefficient values. The memory units are implemented, for example, with registers.

The syndrome circuits also include $2T_{EDC}$ leftover circuits 310 (e.g., 310-1, 310-2, ... 310-$2T_{EDC}$), each coupled to one of the $2T_{EDC}$ parallel multiplier circuits 306. The $2T_{EDC}$ leftover circuits 310 are configured to receive the n-bit leftover symbol(s) from the syndrome input 302 wherein the n-bit leftover symbol(s) are comprised of an (m−n) MSB of the $2T_{EDC}$ m-bit EDC parity symbols. Once the n-bit leftover symbol(s) are received, MSB EDC syndrome signals are computed from the n-bit leftover symbol(s) for each of the $2T_{EDC}$ LSB EDC syndrome signals to form the $2T_{EDC}$ MSB EDC syndrome signals at a leftover circuit output 313 of the leftover circuit 310. Each $2T_{EDC}$ MSB EDC syndrome signal is combined with a corresponding one of the $2T_{EDC}$ LSB EDC syndrome signals and stored in a corresponding one of the memory unit 308, thereby forming the $2T_{EDC}$ syndrome signals.

Figure 10:
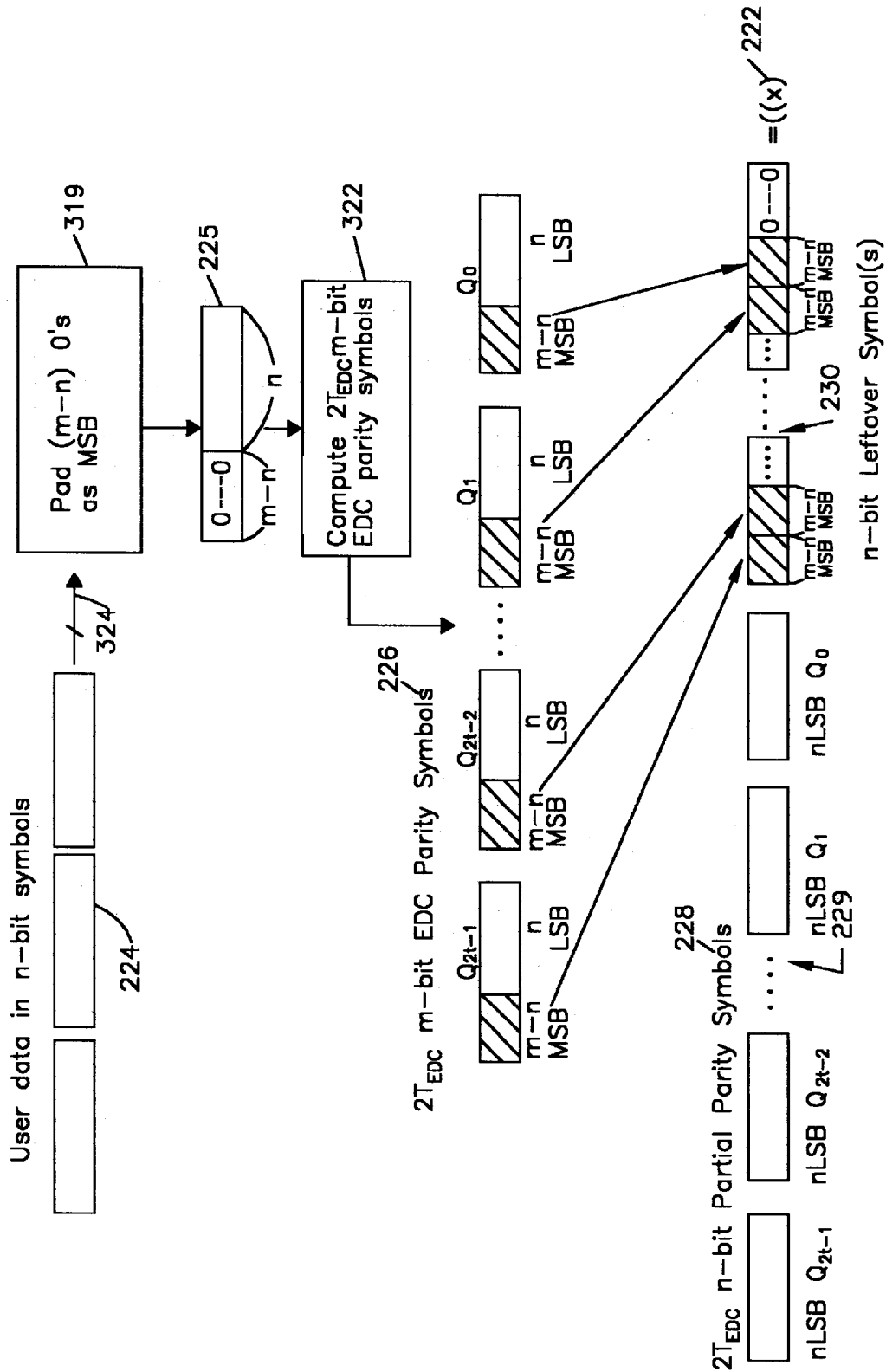
FIG. 10 depicts EDC encoding according to an embodiment of the invention.

FIG. 10 depicts the EDC encoding according to an embodiment of the invention wherein an encoder input 324 receives the user data symbols 224 having an n-bit symbol size based on an n-bit symbols size limitation of the system. However, the encoder 322 is an m-bit EDC encoder, such that it will produce $2T_{EDC}$ m-bit EDC parity symbols. The (m−n) MSB of the user data symbols 224 are padded with (m−n) zeros to form m-bit user data symbols 225 before being fed to the m-bit EDC encoder 322. The m-bit EDC encoder will then generate the $2T_{EDC}$ m-bit; parity symbols 226 from the m-bit user data symbols 225.

However, due to the n-bit symbols size limitation of the system, the $2T_{EDC}$ m-bit EDC parity symbols 226 need to be modified before they can be written to the data storage media (not shown). The m-bit user data symbols 224 contain zeros in their (m−n) MSB and therefore the n LSB of the m-bit user data symbols 224 are written to the data storage media. In order to write the $2T_{EDC}$ m-bit EDC parity symbols 226 to the data storage media, the (m−n) MSB of the $2T_{EDS}$ EDC parity symbols 226 are removed to form $2T_{EDC}$ n-bit partial parity symbols 228. The (m−n) MSB of the $2T_{EDC}$ m-bit EDC parity symbols 226 are used to form at least one n-bit leftover symbol(s) 230. The number of n-bit leftover symbol(s) 230 is equal to:

$$\frac{2T_{EDC}*(m-n)}{n}$$

rounded up to the nearest whole number. Preferably, (($2T_{EDC}*m$) modulo n)=0, such that the (m−n) MSB of the $2T_{EDC}$ m-bit EDC parity symbols 226 completely fill the n-bit leftover symbol(s) 230. Otherwise, any space within the n-bit leftover symbol(s) 230 that does not contain any data is padded with zeros. The user data 224 appended with the $2T_{EDC}$ n-bit partial parity symbols 228 followed by the n-bit leftover symbol(s) 230 forms the EDC codeword C(x) 222 that is written to the storage media.

Figure 11:
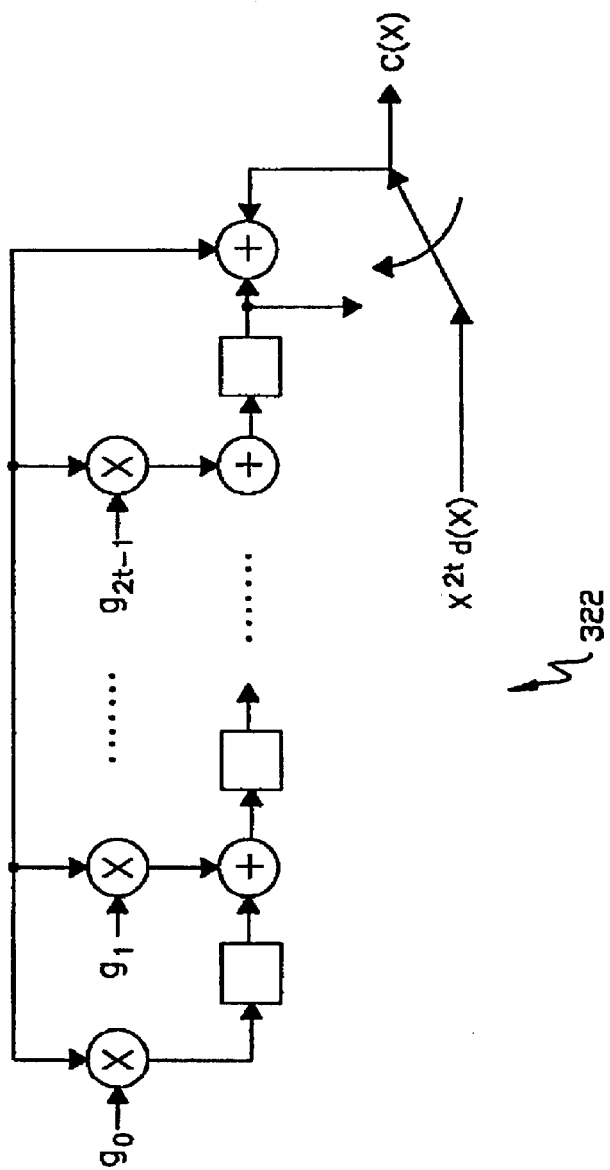
FIG. 11 depicts an encoder for a T-error correction Reed Solomon code as known in the art.

FIG. 11 depicts an encoder 322 for a $T_{EDC}$-error correction Reed Solomon code as known in the art. Details regarding the encoder 322 will be apparent to those skilled in the art of error control systems and are therefore not set forth herein except as needed for a proper understanding of the invention. However, in order to implement the EDC encoding described by the present invention, the encoder 322 is modified as follows.

Figure 8:
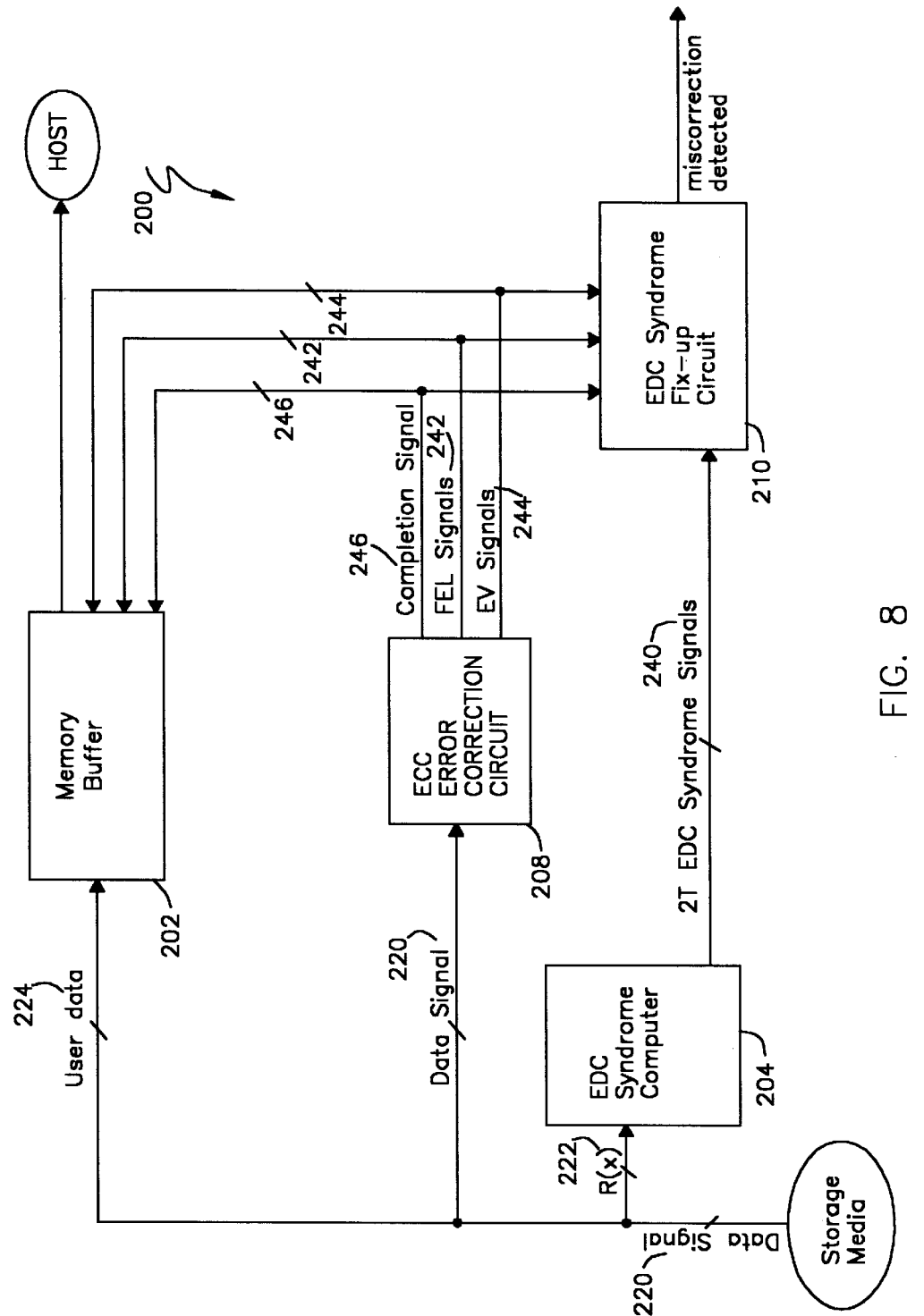
FIG. 8 depicts an error correction and miscorrection detection in data transmission apparatus according to an embodiment of the invention.
Figure 12:
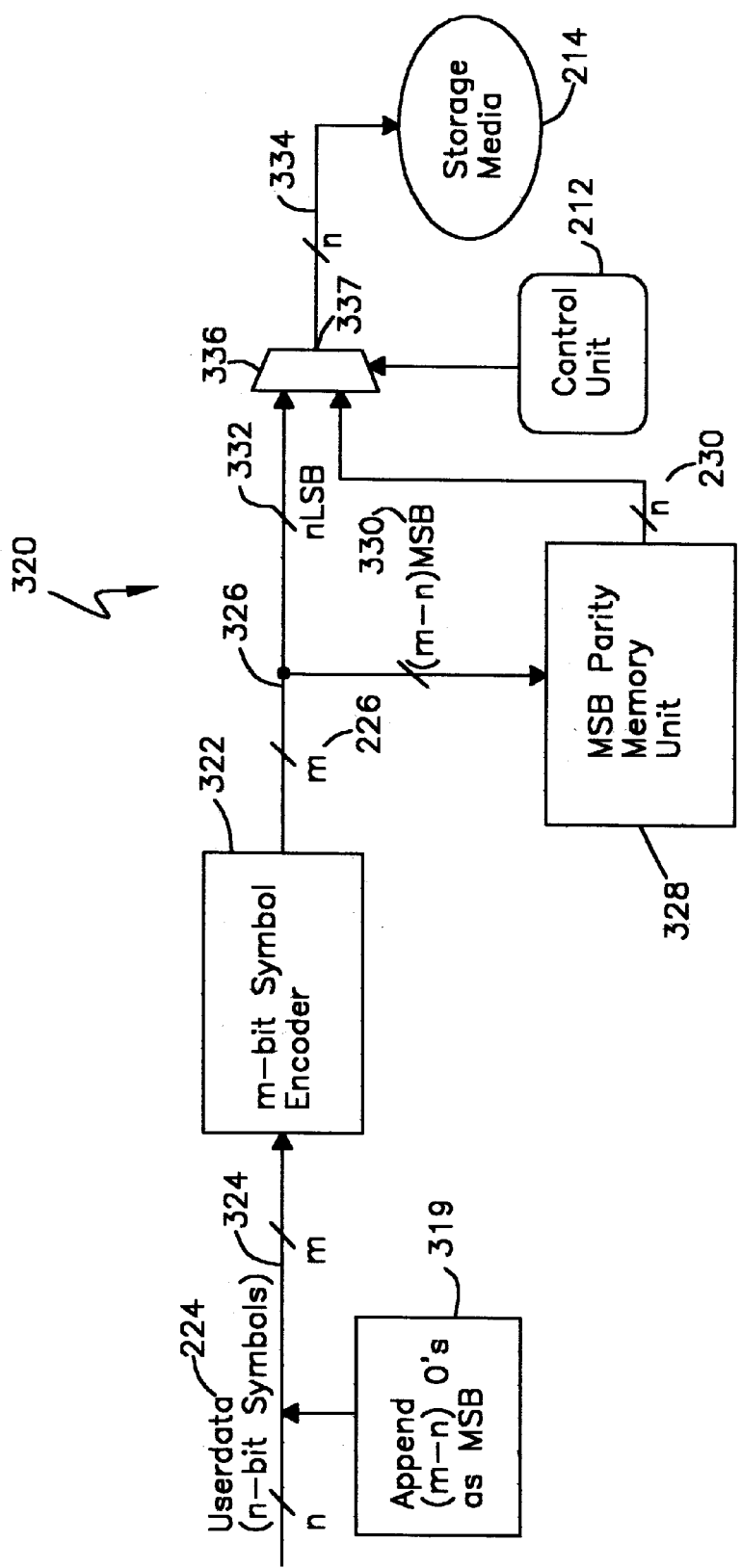
FIG. 12 depicts an EDC encoder according to another embodiment of the invention.

In accordance with another embodiment of the invention depicted in FIG. 12, the error correction apparatus 200 as deacted in FIG. 8 includes an EDC encoder 320. The EDC encoder 320, is configured to receive the user data 224 during an encoding state, and generate the $2T_{EDC}$ EDC m-bit parity symbols 226 from the user data 224. Once generated, the $2T_{EDC}$ EDC m-bit parity symbols 226 are supplied to an output parity bus 326. The prior art encoder 322 is used to generate the $2T_{EDC}$ EDC m-bit parity symbols 226 at the output parity bus 326. However, a MSB parity memory unit 328 is coupled to the output parity bus 326 and configured to receive the (m−n)-MSB 330 of each of the $2T_{EDC}$ m-bit EDC parity symbols 226 to form the n-bit leftover symbol (s). In addition, an n-LSB 332 of each of the $2T_{EDC}$ m-bit EDC parity symbols 226 remain on the output parity bus 326 to form the $2T_{EDC}$ n-bit partial parity-symbols that are appended to the user data 224 along with the n-bit leftover symbol(s) 230 to form the EDC codeword R(X) at an encoder output 334.

The EDC encoder 320 also includes an output parity gate 336. The output parity gate 336 has a parity output 337 and operates in a first parity gate state and a second parity gate state. In the first parity gate state the $2T_{EDC}$ n-bit partial parity symbols 332 on the output parity bus 326 are transferred as the parity output 337 to the encoder output 334. In the second parity gate state the n-bit leftover symbol(s) 230 contained in the MSB parity memory unit 328 are transferred as the parity output 337 to the encoder output 334.

A control unit 212 is configured to control the states of the output parity gate 336, such that the user data 224 is encoded during the encoding state. The output parity gate 336 is in the first parity gate state until the $2T_{EDC}$ n-bit partial parity symbols 332 on the output parity bus 326 are transferred as the parity output 337 to the encoder output 334. The output parity gate 336 then switches to the second parity gate state to transfer the n-bit leftover symbol(s) contained in the MSB parity memory unit 328 as the parity output 337 and to the encoder output 334. The encoding state and the decoding state of the error correction and miscorrection detection apparatus (not shown) are determined by the control unit 212. The output parity gate 336 is, for example a two input one output (2×1) multiplexer.

Figure 13:
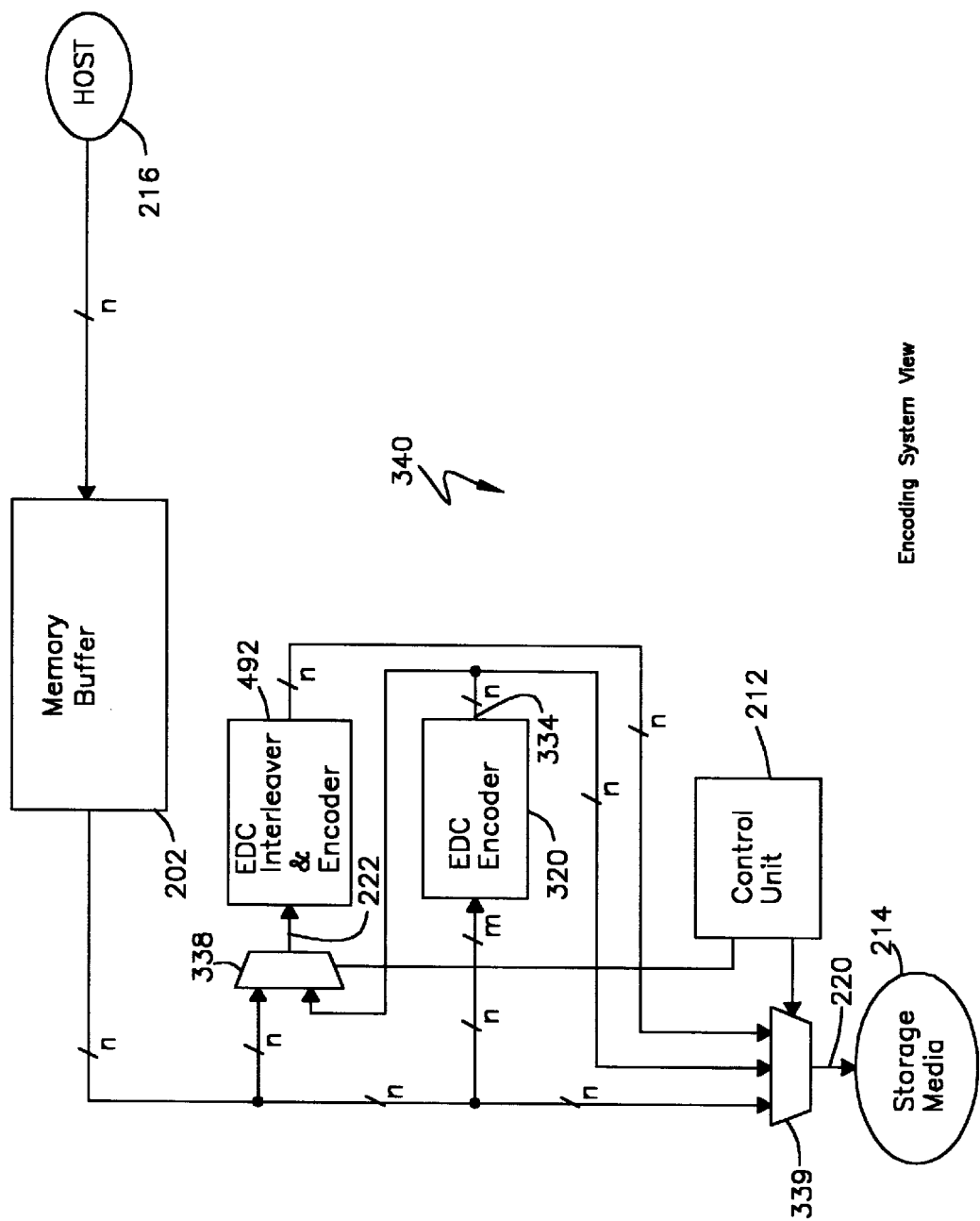
FIG. 13 depicts a system level view of an EDC encoder and an ECC encoder according to an embodiment of the invention.

FIG. 13 depicts a system view of the encoding of the user data with the EDC encoder 320 and an ECC encoder/interleaver 492 to generate the data signal 220. Details regarding the ECC encoder/interleaver 492 will be apparent to those skilled in the art of error control systems and are therefore not set forth herein except as needed for a proper understanding of the invention. The ECC encoder/interleaver 492 is coupled to the encoder output 334 and is configured to receive the EDC codeword R(x) 222 during the encoding state. The EDC codeword R(x) 222 is then interleaved to form a plurality of interleaves. Each interleave is encoded with $2T_{ECC}$ n-bit ECC parity symbols to form the data signal 220 that is then written to a data storage media 214. FIG. 13 depicts one possible way of connecting the EDC encoder 320 and the ECC encoder/interleaver using encoding gates 338 and 339 that are controlled by the control unit 212.

Figure 14:
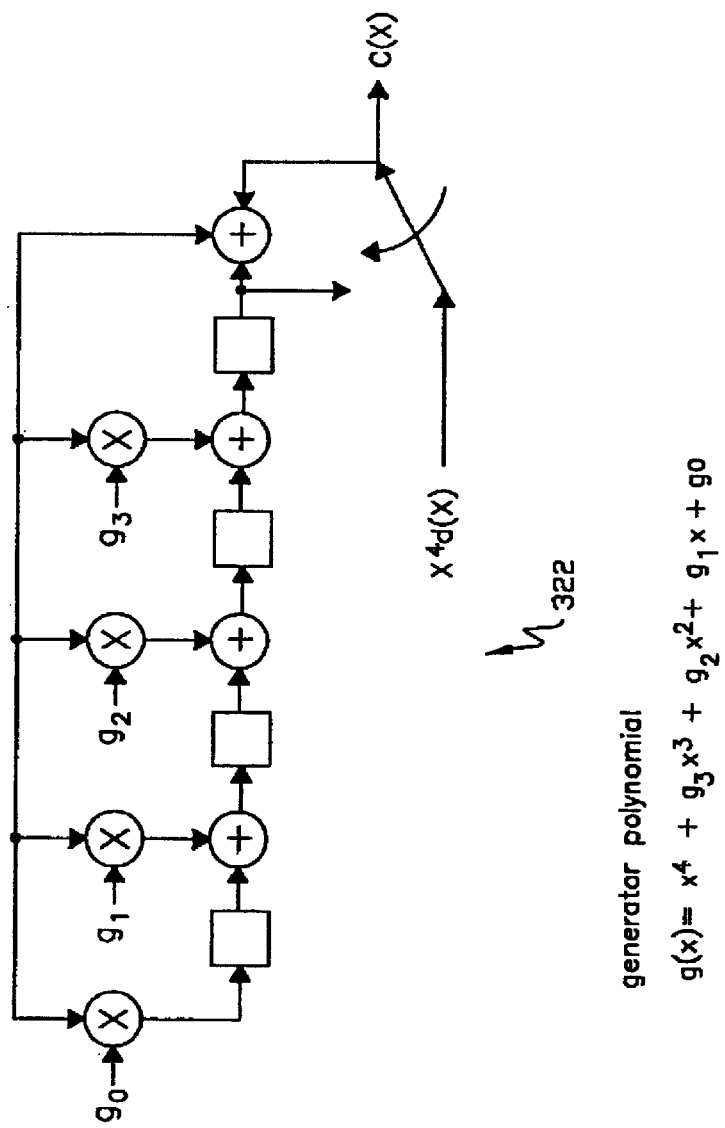
FIG. 14 depicts an encoder for a T=2 error correction Reed Solomon code as known in the art.
Figure 15:
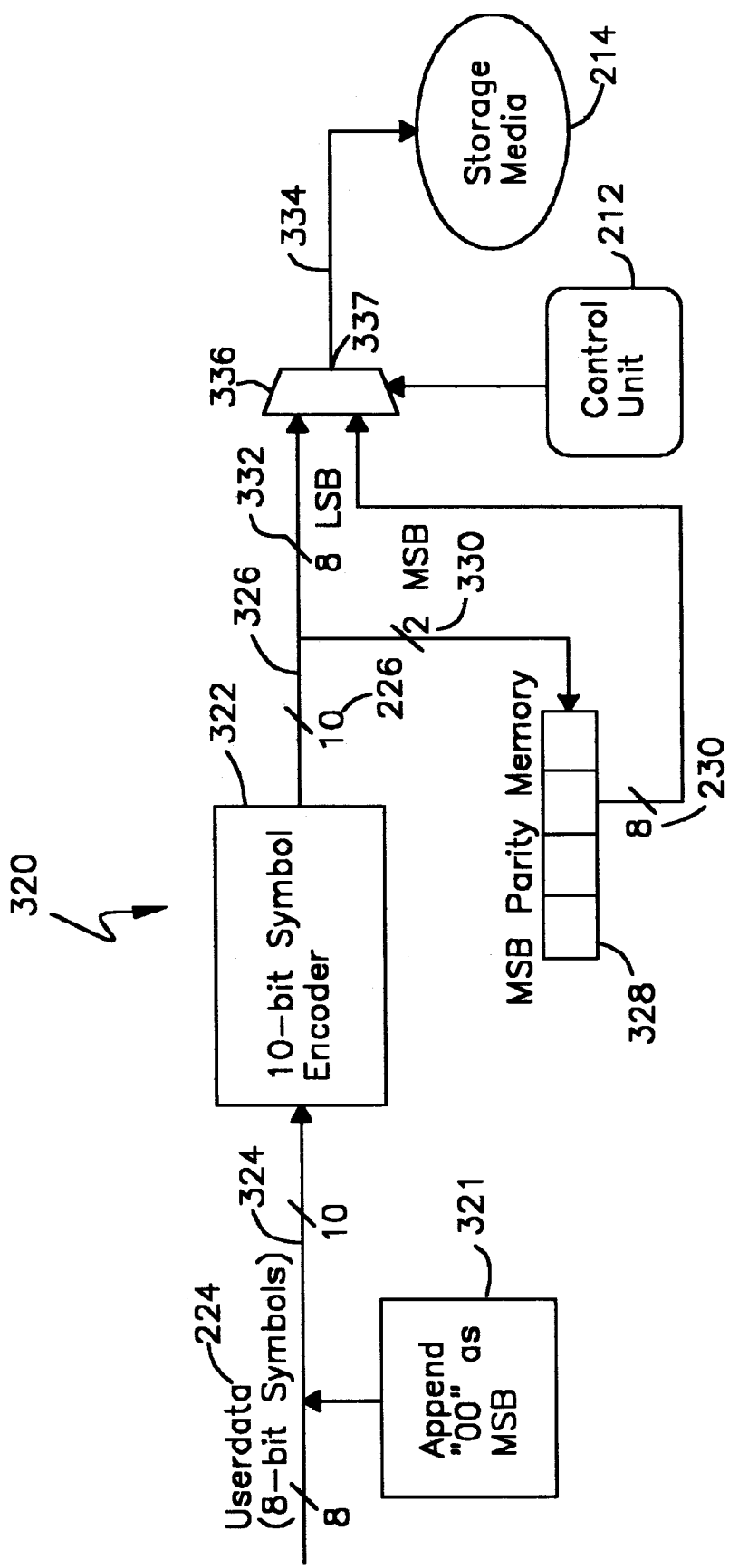
FIG. 15 depicts an EDC encoder using an RS EDC created with a $GF(2^m)$ for T=2, m=10 and n=8 according to a further embodiment of the invention.

FIG. 14 depicts the prior art encoder 322 as 10-bit encoder (m=10) for $T_{EDC}$=2 error correction capability that generates the $2T_{EDC}$ m-bit EDC parity symbols 226 as four 10-bit EDC parity symbols 136, 138, 140 and 142 (as depicted in FIG. 5). The 10-bit encoder is used in an exemplary embodiment of the EDC encoder 204 as depicted in FIG. 15 for an eight-bit, byte-base system (n=8). The 2 MSB 330 of each of the four 10-bit EDC parity symbols are removed and stored in the MSB parity memory 328 to form the n-bit leftover symbol(s) 230 as a leftover byte 152 (as depicted in FIG. 5). The remaining 8 LSB of the four 10-bit EDC parity symbols form the $2T_{EDC}$ n-bit partial parity symbols 332 as four EDC parity bytes. The user data 224 along with the four parity bytes 332 and the leftover byte 230 form the EDC codeword R(x) at the encoder output 334. The MSB parity memory is, for example, an 8-bit shift by-2 register.

Figure 16:
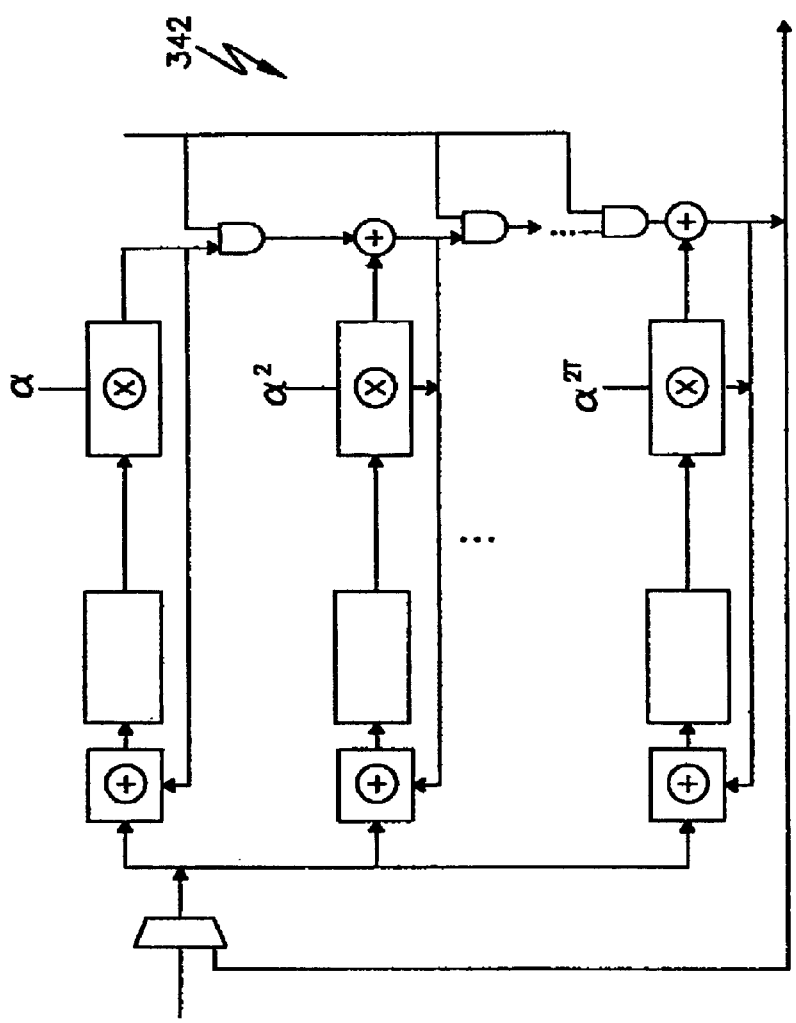
FIG. 16 depicts an encoder/syndrome computer as known in the art.

FIG. 16 depicts an encoder/decoder 342 as known in the art. The encoder/decoder 340 is for example an encoder/decoder as described in U.S. Pat. No. 5,444,719. However, in order to implement the syndrome generation as described by the present invention, the encoder/decoder 340 is modified as depicted in FIG. 17.

Figure 17:
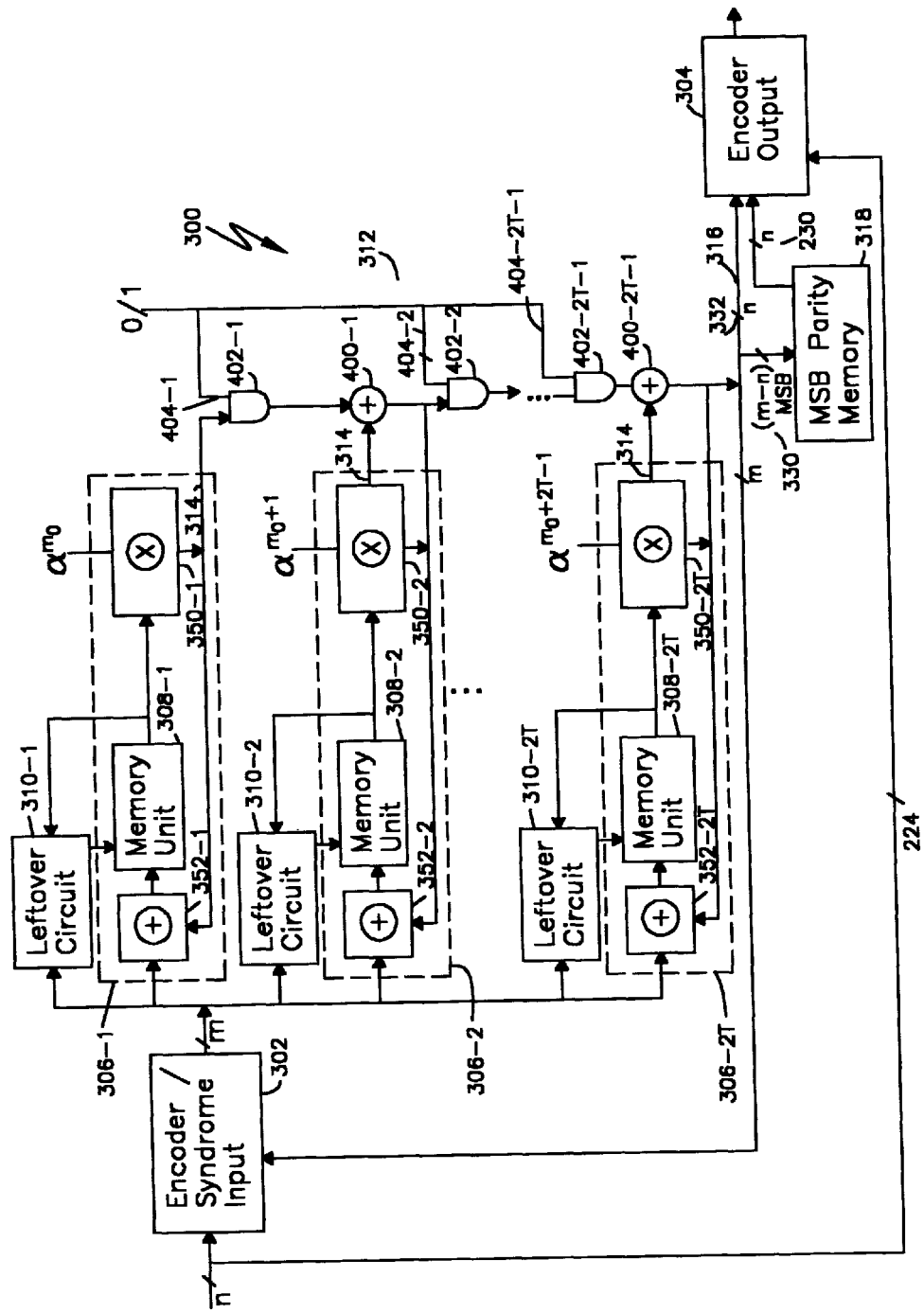
FIG. 17 depicts an encoder/syndrome computer circuit according to an embodiment of the invention.

As depicted in FIG. 17, the syndrome generator circuit 204 (as depicted in FIG. 8) is an encoder/syndrome computer circuit 300 according to a further embodiment of the invention. The encoder/syndrome computer circuit 300 includes a parity circuit 312 that is coupled to an output 314 of each of the $2T_{EDC}$ multiplier circuits 306. The parity circuit 312 has an enabled state and a disabled state wherein the parity circuit 312 is in the disabled state during the decoding state and in the enabled state during the encoding state. In the enabled state, the parity circuit 312 allows generation of the $2T_{EDC}$ m-bit EDC parity symbols and supplies the $2T_{EDC}$ m-bit EDC parity symbols to an output parity bus 316. A MSB parity memory unit 318 is coupled to the output parity bus 316. The MSB parity memory unit 318 is configured to receive the (m−n) MSB 330 of each of the $2T_{EDC}$ m-bit EDC parity symbols to form the n-bit leftover. symbol(s), such that an n LSB 332 of each of the $2T_{EDC}$ m-bit EDC parity symbols remain on the output parity bus 316 to form the $2T_{EDC}$ n-bit partial parity symbols. The $2T_{EDC}$ n-bit partial parity symbols and the n-bit leftover Symbols 230 are appended to the user data 224 to form the EDC codeword R(X) 222 at the encoder output 304. As previously described, the number of the n-bit leftover symbols is equal to =(r*m)/n, where ((r*m) modulo n)=0. Otherwise, a portion of one of the n-bit leftover symbols is padded with zeros.

The parity circuit 312 is comprised of a GF adder 400 (i.e. bitwise XOR) coupled between $2T_{EDC}$−1 of each of the root multipliers and $2T_{EDC}$−1 of each of the GF adders 352. A gate 402, for example an AND gate, is coupled between each of the GF adders 352 and an output 314 of each of the $2T_{EDC}$ multipliers 306. Each of the gates 402 is configured to switch to an enabled state during the encoding state and connect each of the $2T_{EDC}$ multipliers 306 with the output parity bus 316 wherein an input 404 to the gate 402 is one. The gates 402 switch to a disabled state during the decoding state and disconnect the $2T_{EDC}$ multipliers 306 from the output parity bus 316 wherein the input 404 to the gate 402 is zero. The gates 402 prevent or enable the output from each of the $2T_{EDC}$ multipliers 306 from reaching the output parity bus 316 depending on the inputs to the gates 402.

Figure 18:
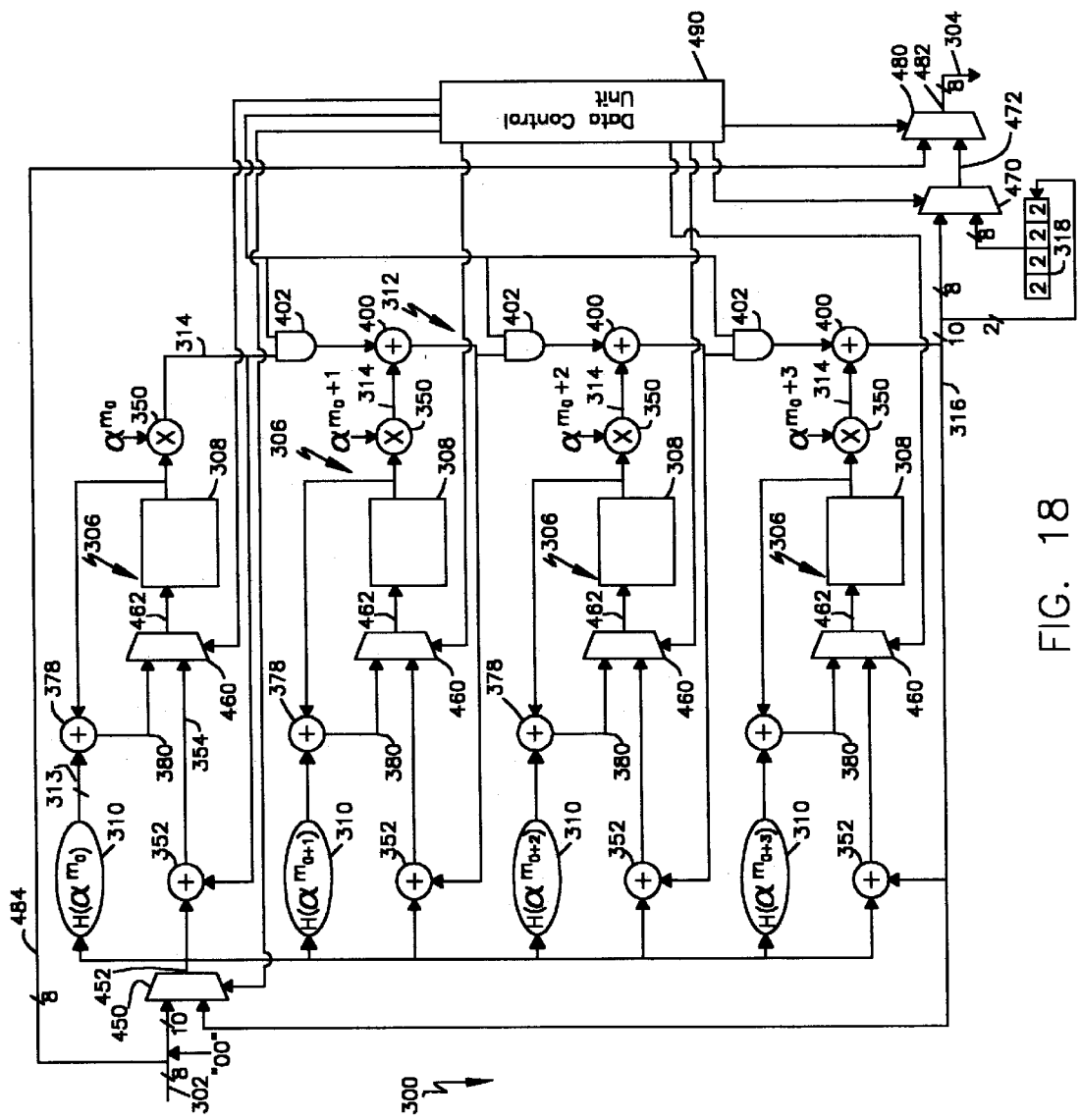
FIG. 18 depicts the encoder/syndrome computer circuit according to an exemplary embodiment of the invention.

An exemplary embodiment of the encoder/syndrome computer circuit 300 is depicted with reference to FIG. 18. This embodiment describes the design of the encoder/syndrome computer circuit 300 in a $T_{EDC}$=2 error correction and miscorrection detection apparatus 200 in an 8-bit, byte based system (n=8). The LBC is a Reed Solomon (RS) created with a Galois Field (GF) of order $2^{10}$ (GF($2^{10}$)), such that m=10, n=8 and $T_{ECC}$=5. The EDC encoder/syndrome computer circuit 300 further includes an input data gate 450 that has a data output 452 and operates in a first state and a second state.

In the first input data gate state, the data received by the encoder/syndrome input 302 is transferred as the data output 452. In the second state the $2T_{EDC}$ m-bit EDC parity symbols are 4 10-bit EDC parity symbols, supplied to the output parity bus 316 and transferred as the data output 452. The data output 452 of the input gate 450 is provided in parallel to each of the $2T_{EDC}$ multipliers 306 and the $2T_{EDC}$ leftover circuits 310 (310-1, . . . , 310-2T). $2T_{EDC}$ multiplexer gates 460 each have a multiplexer output 462 and operate in a first state and a second state. In the first state, the sum output 354 of one of the $2T_{EDC}$ GF adders 352 (352-1, . . . , 352-2T) is transferred to one of the memory units 308 as the multiplexer output 462.

An output parity gate 470 has a parity output 472 and operates in a first parity gate state and a second parity gate state. In the first parity gate state the $2T_{EDC}$ n-bit partial parity symbols are 4 EDC parity-bytes on the output parity bus 316 and transferred as the parity output 472. In the second parity gate state the n-bit leftover symbols are a leftover byte contained in the MSB parity memory unit 318 and transferred as the parity output 472. An output data gate 480 has an output 482 and operates in a first output data gate state and a second output data gate state. A feed-forward bus 484 is coupled to the syndrome input 302 and contains the data received by the syndrome input 302. In the first output data gate state, the data contained on the feed-forward bus 484 is transferred as the output 482 of output data gate 480 to the encoder output 304. In the second output data gate state the parity output 472 of the output parity gate 470 is transferred as the output 482 of the output data gate 480 to the encoder output 304.

A data control unit 490 is configured to control the states of the gates (450, 460, 470, and 480). During the encoding state the parity circuit 312 is in the enabled state, the input data gate 450, the $2T_{EDC}$ multiplexer gates 460, the output parity gate 470, and the output data gate 480 their respective first states until the data received by the encoder/syndrome input 302 is completely transferred as the data output 452 of the input data gate 450 and as the output 482 of the output data gate 480 to the encoder output 304. Once the data is completely transferred the data control unit 490 switches, the input data gate 450 and the output data gate 480 to their respective second states such that the 4 EDC parity-bytes are transferred as the output 482 of the output data gate 480 to the encoder output 304. Once the 4 EDC parity-bytes are transferred the data control unit 490 switches, the output parity gate 470 to the second state such that the leftover-byte is transferred as the output 482 of the output data gate 480 to the encoder output 304. Once leftover-byte is transferred as the output 482 of the output data gate 480, the encoder output 304 transfers the EDC codeword R(X).

During the decoding stage the parity circuit 314 is in the disabled state, the input data gate 450 and the $2T_{EDC}$ multiplexer gates 460 are in their respective first states until the leftover byte is received by the syndrome input 302. Once the leftover-byte(s) is received, the data control unit switches the $2T_{EDC}$ multiplexer gates 460 to their respective second states such that the leftover circuit output 313 of the $2T_{EDC}$ leftover circuits 310 is added to the contents of the memory units 308 and transferred as the multiplier output 462 of each of the $2T_{EDC}$ multiplexer gates 460 and stored in the memory units 308 to form the $2T_{EDC}$ EDC syndrome signals. The gates described above are for example, 2-input 1-output (2×1) multiplexers. Once the syndrome computation is complete, the $2T_{EDC}$ syndromes signals are transferred/read from the memory units 308.

Figure 19:
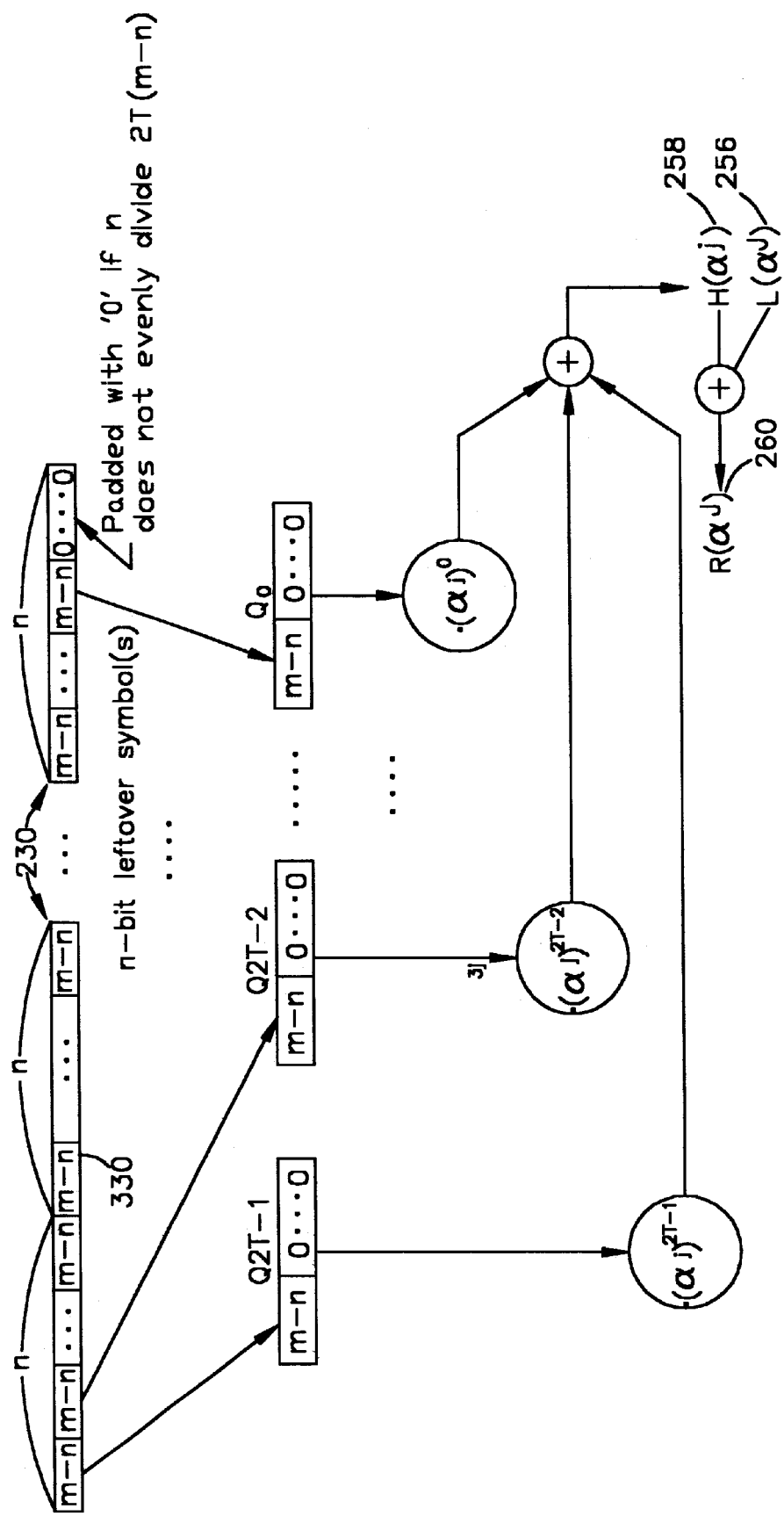
FIG. 19 depicts a computation of a Jth one of the $2T_{EDC}$ MSB EDC syndromes signals from the n-bit leftover symbol (s)

FIG. 19 depicts a computation of one of the $2T_{EDC}$ leftover syndromes according to an embodiment of the invention. The (m−n) MSB 330 contained in the n-bit leftover symbol(s) are used to created $2T_{EDC}$ MSB m-bit parity symbols ($Q_{2TEDC-1}$, $Q_{2TEDC-2}$, . . . , $Q_1$, $Q_0$). The $2T_{EDC}$ MSB m-bit parity symbols are formed by padding the (m−n) MSB 330 with n-zeros. Each of the 2T MSB m-bit parity symbols are then multiplied by an Ith power of $\alpha^J$ as follows: $Q_{2T-1}*(\alpha^J)^{2T-1} + Q_{2T-2}*(\alpha^J)^{2T-2} + \ldots Q_1*(\alpha^J) + Q_0$ to form a Jth MSB EDC syndrome signal $H(\alpha^J)$ 258, where I=$2T_{EDC}-1, 2T_{EDC}-2, \ldots, 1, 0$. The value $\alpha^J$ is a Jth power of the primitive root $\alpha$ used to generate the Jth LSB EDC syndrome signal $L(\alpha^J)$ 256. The Jth MSB EDC syndrome $H(\alpha^J)$ 258 is then combined with the Jth LSB EDC syndrome signal $L(\alpha^J)$ 256 to from a Jth one of the $2T_{EDC}$ EDC syndrome signals $R(\alpha^J)$ 260.

Figure 20:
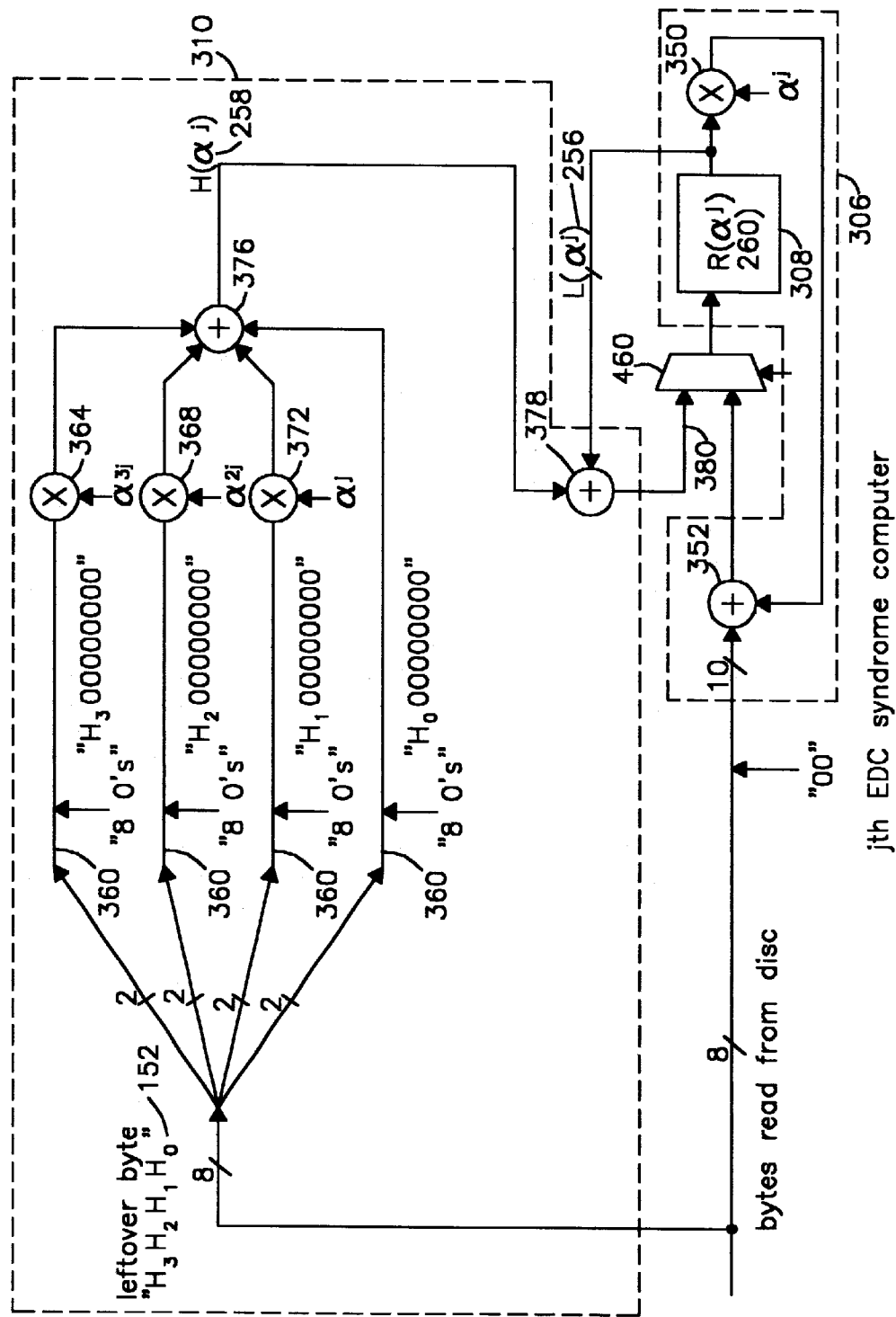
FIG. 20 depicts a leftover circuit according to an embodiment of the invention.

FIG. 20 depicts an exemplary embodiment of leftover circuit 310 coupled to one of the memory units 308 of one of the $2T_{EDC}$ syndrome computer circuits 306 by a multiplexer gate 460. This embodiment describes the design of the leftover circuit 310 in a $T_{EDC}=2$ error correction and miscorrection detection apparatus 200 in a 8-bit, byte based system (n=8). The LBC is a Reed Solomon (RS) created with a Galois Field (GF) of order $2^{10}$ ($GF(2^{10})$), such that m=10, n=8 and $T_{ECC}=5$. The leftover circuit 310 includes a padder 360 configured to receive the n-bit leftover symbol(s) as a leftover byte from the syndrome input 302. A padder is a circuit that inserts zeros into designated locations of a symbol.

Once received, the padder 360 generates the $2T_{EDC}$ m-bit MSB parity symbols as our MSB 10-bit parity symbols ($H_3$, $H_2$, $H_1$ and $H_0$) by padding each of the two MSB used to form the leftover byte with 8-zeros. An $H_3$ GF multiplier 364 is coupled to the padder 360 and configured to multiply $H_3$ by $\alpha^{3J}$ and generate $H_3*\alpha^{3J}$. An $H_2$ GF multiplier 368 is coupled to the padder 360 and configured to multiply $H_2$ by $\alpha^{2J}$ and generate $H_2*\alpha^{2J}$. An $H_1$ GF multiplier 372 is coupled to the padder 360 and configured to multiply $H_1$ by $\alpha^J$ and generate $H_1*\alpha^J$. The leftover GF adder 376 is coupled to the $H_3$ GF multiplier 362, the $H_2$ GF multiplier 366, the $H_1$ GF multiplier 370 and the padder 360, and is configured to form the Jth MSB EDC syndrome signal $H(\alpha^J)$ 258 represented by the expression $H_3\alpha^{3J} + H_2*\alpha^{2J} + H_1*\alpha^J + H_0$.

For example, for $T_{EDC}=2$, four MSB syndromes would be calculated as follows: (1) $H_3*\alpha^3 + H_2*\alpha^2 + H_1*\alpha + H_0$(J=1); (2) $H_3*\alpha^6 + H_2*\alpha^4 + H_1*\alpha^2 + H_0$(J=2); (3) $H_3*\alpha^9 H_2*\alpha^6 + H_1*\alpha^3 + H_0$(J=3); and (4) $H_3*\alpha^{12} + H_2*\alpha^8 + H_1*\alpha^4 + H_0$(J=4). The EDC syndrome signal $L(\alpha^J)$ 256 is the syndrome for a Jth one of the $2T_{EDC}$ multipliers 306. A GF adder 378 is configured to combine the Jth MSB EDC syndrome signal $H(\alpha^J)$ 258 and the Jth LSB EDC syndrome $L(\alpha^J)$ 256 by an XOR operation to form the Jth one of the $2T_{EDC}$ EDC syndrome signals $R(\alpha^J)$ 260 at a syndrome output 380 and store the $R(\alpha^J)$ 260 in the memory unit 308. In other words, $R(\alpha^J)=H(\alpha^J)$ XOR $L(\alpha^J)$.

Figure 21:
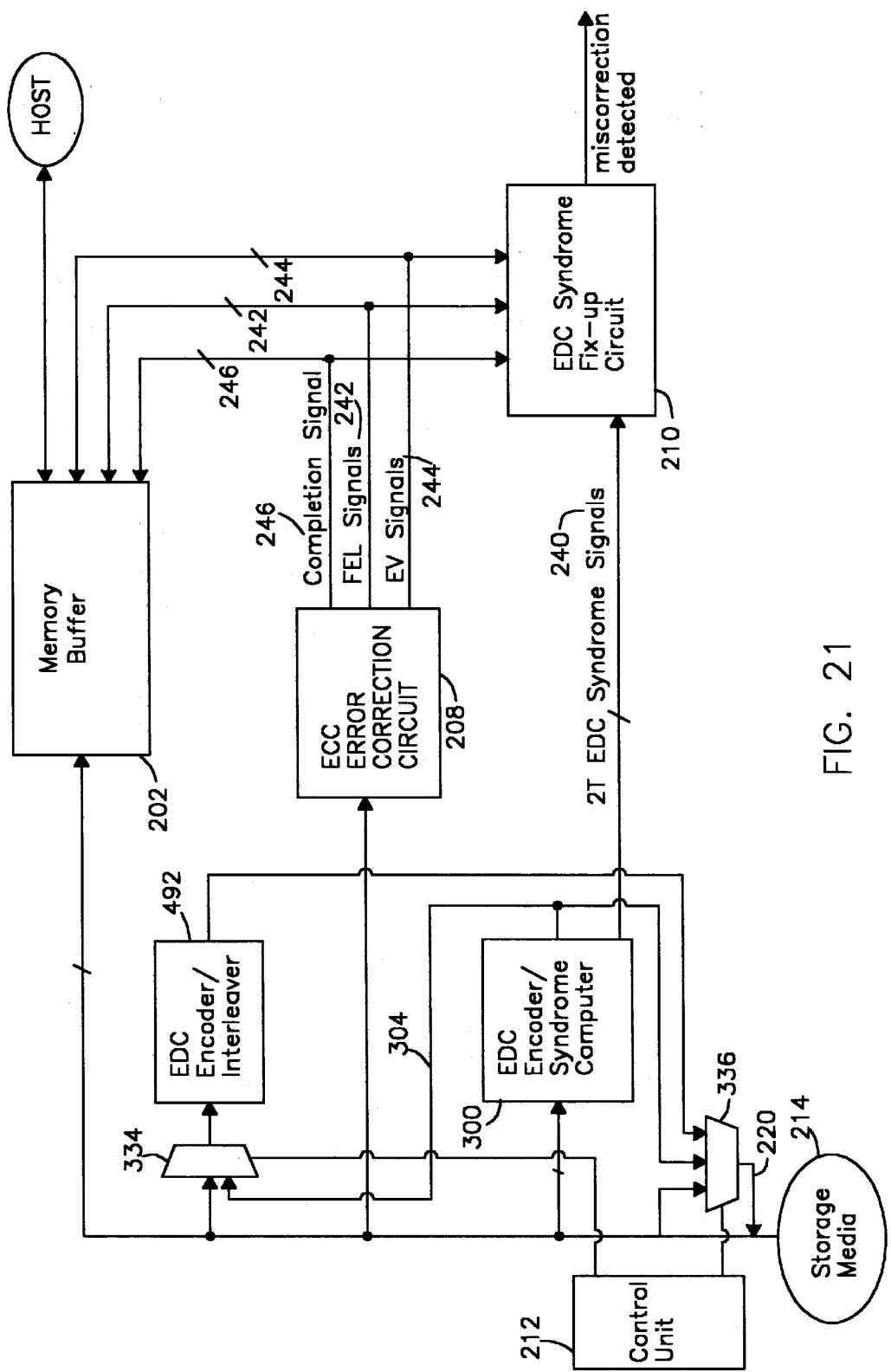
FIG. 21 depicts an encoding/correction and miscorrection detection in data transmission apparatus according to an exemplary embodiment of the invention.

An exemplary embodiment of the error correction and miscorrection detection in data transmission apparatus 200 is depicted with reference to FIG. 21. The apparatus further includes an ECC encoder/interleaver 492 coupled to the encoder/syndrome output 304. The ECC encoder/interleaver 492 is coupled to the encoder output 304 and is configured to receive the EDC codeword R(x) 222 during the encoding state. The EDC codeword R(x) 222 is then interleaved to form a plurality of interleaves. Each interleave is encoded with $2T_{ECC}$ n-bit ECC parity symbols to form the data signal 220 that is then written to a data storage media 214. The plurality of interleaves is, for example equal to four.

Figure 22:
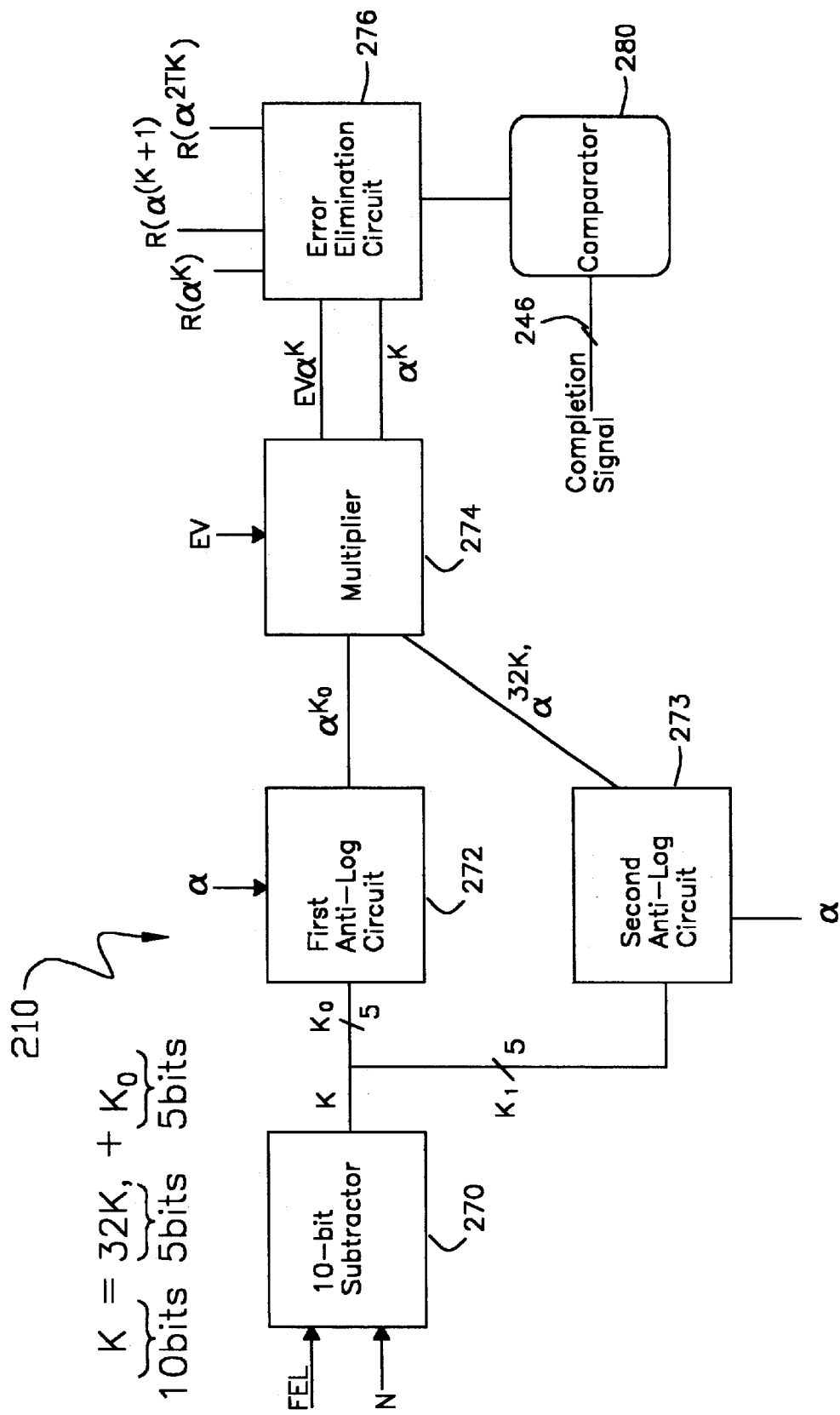
FIG. 22 depicts an EDC syndrome fix-up circuit according to an embodiment of the invention.

A further embodiment of the EDC syndrome fix-up circuit 210 is depicted with reference to FIG. 22 for m=1. The polynomial evaluation circuit 210 further comprises a first adder/subtractor 270 configured to subtract a number (N) representing the amount of bytes of the user data plus $2T_{EDC}-1$ from the FEL signal 242 to form a value (K) representing an error position within the EDC codeword R(X). In order to simplify the antilogarithmic computations required by the fix-up circuit 210, K is divided such that $K=32K_1+K_0$ ($K_1$ is the 5 MSB of K and $K_0$ is the 5 LSB of K). A first anti-logarithmic circuit 272 is configured to compute a $K_0$th power of α ($α_{K0}$). A second anti-logarithmic circuit 273 is configured to compute an $32K_1$th power of α ($α^{32K1}$). A GF multiplier 274 is configured to multiply $α^{K0}$ by $α^{32K1}$ to generate $α^K$, then to multiply $α^K$ by the EV signal 244 to generate $EV*α^K$, wherein $EV*α^K$ is one of the EDC error contribution signals corresponding to the $2T_{EDC}$ EDC syndrome R(α). An error elimination circuit 276 is configured to generate $2T_{EDC}-1$ EDC error contribution signals beginning with $EV*α^{2K}$ corresponding to the $2T_{EDC}$ EDC syndrome $R(α^2)$ ($R(α^2)$ syndrome) and removing the $EV*α^{2K}$ from the $R(α^2)$ syndrome and ending with $EV*α^{2TK}$ corresponding to one of the 2T EDC syndrome signal generated by $R(α^{2T})$ ($R(α^{2T})$ syndrome) and removing the $E*α^{2TK}$ from the $R(α^{2T})$ syndrome. A comparator 280 is configured to receive and evaluate each of the $2T_{EDC}$ EDC syndrome signals and determine the value at the adjusted syndromes. If the value of the syndromes is not equal to zero once the completion signal 246 is received, a miscorrection is detected.

Operation

Figure 23:
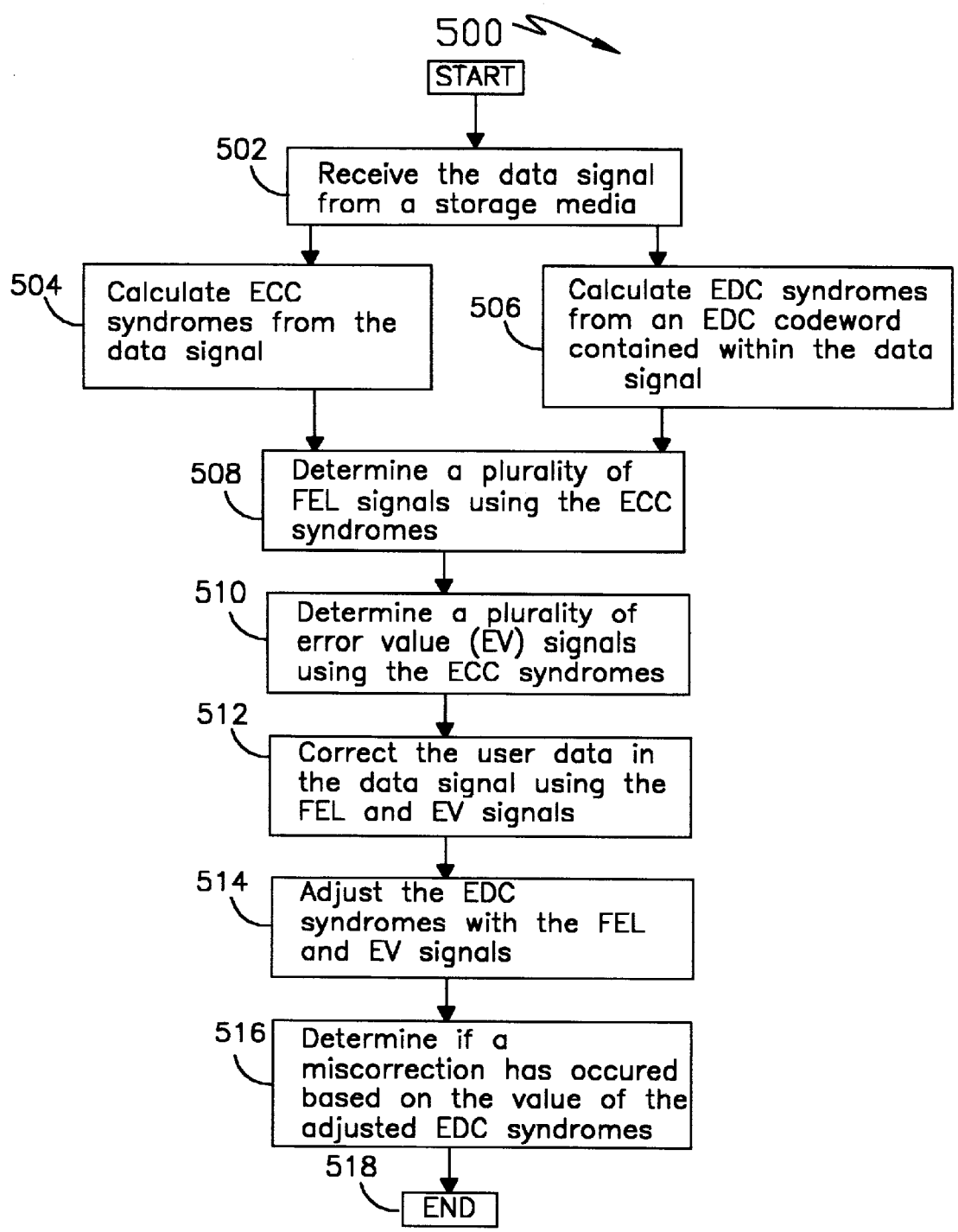
FIG. 23 is a flow chart depicting a method for error correction and miscorrection detection in digital transmission according to an embodiment of the invention.

FIG. 23 depicts a procedure 500 for a first embodiment of an error correction and miscorrection detection in data transmission using a Linear Block Code (LBC), for example, as depicted in FIG. 8. At step 502, the data signal 220 is received. The user data contained within the data signal is stored in the memory buffer 202. At step 504, ECC syndromes are calculated from the data signal 220. At step 506, EDC syndromes are calculated from the EDC codeword, R(x) 222 contained within the coded data signals 220. Steps 504 and 506 can be done in parallel. At step 508, a plurality of forward error location (FEL) signals 242 are determined using the ECC syndromes. At step 510, a plurality of error value (EV) signals 244 are determined using the ECC syndromes. At step 512, the FEL signals 242 and EV signals 244 are used to create an ECC error signal that is applied to the data signal to correct the user data 224. At step 514, the FEL signals 242 and EV signals 244 are used to create an EDC error signal that is applied to the EDC syndromes 240 such that the EDC syndromes are adjusted. At step 516, it is determined whether a miscorrection has occurred based on the value of the adjusted syndrome signals and the procedure completes (step 518). The EDC error signal is actually created by modifying the ECC signal by altering the FEL signals 242 to reflect the error location within the EDC codeword R(x), and a miscorrection is detected if the value of the adjusted EDC syndromes 240 is not equal to zero after the EDC signal is applied for each data corruption.

Figure 24:
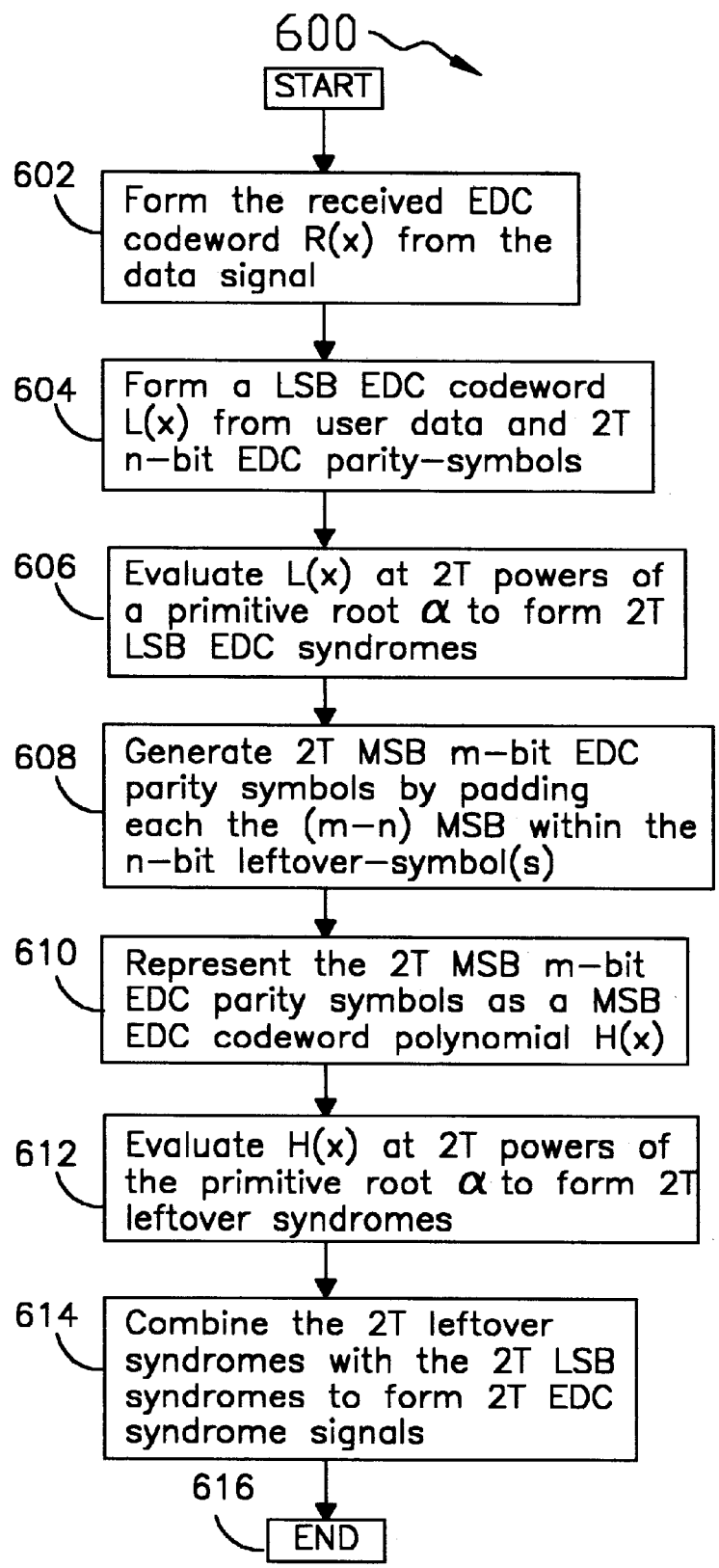
FIG. 24 is a flow chart depicting methods steps for forming $2T_{EDC}$ EDC syndrome signals according to an embodiment of the invention.

FIG. 24 depicts additional procedural method steps 600 for calculating the EDC syndromes of step 506 of the error correction and miscorrection detection in data transmission procedure, for example, in the EDC syndrome computer 204, as depicted in FIG. 9. At step 602, a received EDC codeword R(x) 222 is formed from the data signal 220. At step 604, a LSB EDC codeword polynomial L(X) is formed such that the user data and the $2T_{EDC}$ n-bit partial parity-symbols contained within the EDC codeword R(x) 222 are represented as coefficients of L(X). At step 608, L(X) is evaluated at $2T_{EDC}$ consecutive powers of the primitive root α, beginning with $L(α^{m0})$ and ending with $L(α^{m0+2-1})$ to form the $2T_{EDC}$ LSB EDC syndrome signals 252. The primitive root a is an element of a Galois Field (GF) of order $2^m$ ($GF(2^m)$). At step 610, $2T_{EDC}$ MSB m-bit parity symbols are formed by padding each of the (m−n)-MSB contained within the n-bit leftover symbols with n-zeros as the LSB. At step 612, the $2T_{EDC}$ MSB m-bit parity symbols are represented as coefficients of a MSB EDC codeword polynomial H(X). At 612, H(X) is evaluated at $2T_{EDC}$ consecutive powers of the primitive root α, beginning with $H(α^{m0})$ and ending with $H(α^{m0+2T-1})$ to form the $2T_{EDC}$ MSB EDC syndrome signals 254. AT step 614, the $2T_{EDC}$ MSB EDC syndrome signals 254 are combined with the $2T_{EDC}$ LSB EDC syndrome signals 252 to form the $2T_{EDC}$ EDC syndrome signals 240.

FIG. 25 depicts additional procedural steps 700 for detecting a miscorrection in steps 514 and 516 of error correction and miscorrection detection in data transmission procedure, for example, as in the EDC syndrome fix-up circuit 210 depicted in FIG. 8. At step 702, all error contribution are removed from each of the $2T_{EDC}$ EDC syndrome signals. At step 704, its determined whether the $2T_{EDC}$ EDC syndrome signals are equal to 0 as a result of the step 704. Finally at step 706, when the $2T_{EDC}$ EDC syndrome signals are not equal to 0 because a miscorrection has occurred, uncorrectable data is reported.

FIG. 26 depicts additional procedural method steps 800 for removing the error contribution from the $2T_{EDC}$ syndrome signals in step 202 of the error correction and miscorrection detection in data transmission procedure, for example, as in the EDC syndrome fix-up circuit depicted in FIG. 22. At step 802, a FEL signal and an error value signal (EV) are received. At step 804, an error location (K) within the received codeword R(x) EDC is determined from the FEL signal. At step 806, $2T_{EDC}$ EDC error signals are calculated for $2T_{EDC}$ consecutive powers of the primitive root a beginning with $EV*α^{m0K}$ and ending with $EV*α^{(m0+2T-K)}$, one for each of the $2T_{EDC}$ EDC syndromes signals. At step 808, each EDC error signal is subtracted from a respective one of the $2T_{EDC}$ EDC syndrome signals. Finally at step 810 a determination is made as to whether any additional FEL and EV signal(s) are received and if so, steps 802 through 808 are repeated until the FEL signals 242 and EV signals 244 are no longer received.

Figure 27:
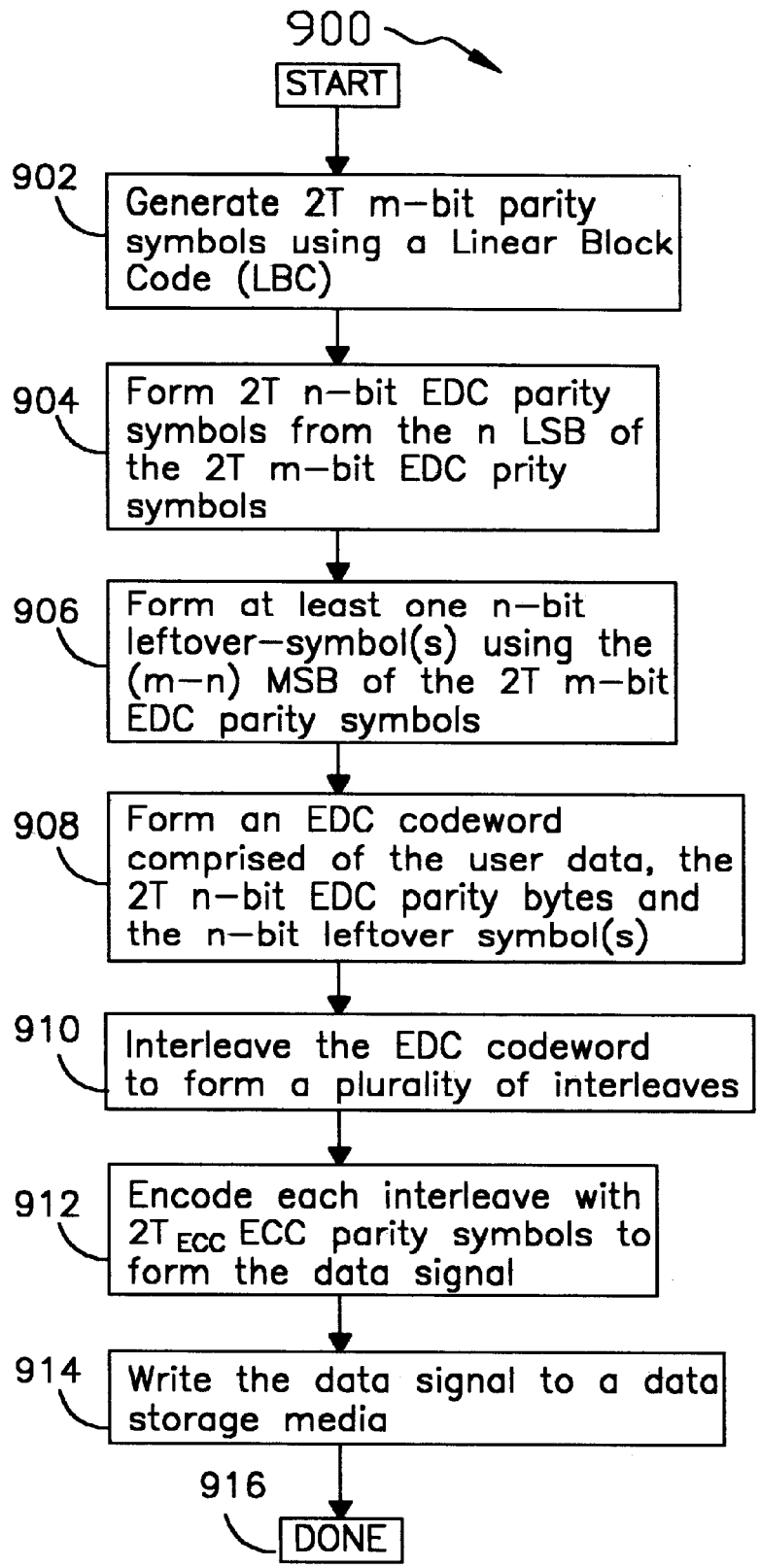
FIG. 27 is a flow chart depicting methods steps for encoding the user data to form the coded data signal according to an embodiment of the invention.

FIG. 27 depicts additional procedural method steps 900 for forming the data signal 220 before it is received in step 502 of error correction and miscorrection detection in data transmission procedure, for example, as in the encoder/syndrome computer 300 and ECC encoder/interleaver 492 depicted in FIG. 21. At step 902, $2T_{EDC}$ m-bit parity symbols are generated with the LBC code. At step 904, $2T_{EDC}$ n-bit partial parity symbols are then formed from the n-bit LSB of each of the $2T_{EDC}$ m-bit parity symbols. At step 906, an n-bit leftover symbol is next formed using the (m−n) MSB of each of the $2T_{EDC}$ m-bit EDC parity symbols, such that together the $2T_{EDC}$ n-bit partial parity symbols and the n-bit leftover symbols form the $2T_{EDC}$ m-bit EDC parity symbols. At step 908, an EDC codeword polynomial C(x) is formed, such that the user data, the $2T_{EDC}$ n-bit partial parity symbols and the n-bit leftover-symbols are represented as coefficients of C(x). At step 910, the EDC codeword polynomial C(x) is interleaved to form a plurality of interleaves. At step 912, each interleave is encoded with $2T_{ECC}$ of n-bit ECC parity symbols to form the data signal. Finally at step 914, the data signal is written to a data storage media.

An error correction and miscorrection detection in data transmission apparatus 200 includes a memory buffer 202 for storing user data 224 contained in a data signal 220. A syndrome computer circuit 204 generates a plurality of EDC syndromes 240 from the received EDC codeword R(x). The EDC codeword 222 includes user data 224 encoded with a plurality of m-bit EDC parity symbols 226. The EDC codeword 222 is encoded with plurality of n-bit ECC parity symbols to form the data signal 220, such that m>n. An ECC error correction circuit 208 corrects the user data 224 with an error signal generated for each corruption of the data signal 220. A completion signal 246 is generated once correction of the user data 224 is complete. A syndrome fix-up circuit 210 is configured to adjust the EDC syndromes 240 based on the received error signals. Once the completion signal 246 is received, a miscorrection by the ECC error correction circuit 208 is detected if a value of the adjusted syndromes 240 is not equal to zero.

Exemplary embodiments have been described with reference to specific configurations. Those skilled in the art will appreciate that various changes and modifications can be made while remaining within the scope of the claims. It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the above EDC generalizes to Linear Block Codes such as Reed Solomon Codes and is not limited to Galois Fields of order $2^{10}$, values of $T_{EDC}$ other than $T_{EDC}=2$ and values of $T_{ECC}$ other than 5. In addition, various syndrome computer circuit are possible while still remaining within the scope of the claims.

The invention provides many advantages over known techniques. Advantages of the invention include the ability to detection miscorrections by the ECC without having to explicitly combine the user data to form the EDC codeword R(x). This results in a system in which $2^m-1$ or more symbols per codeword are possible; namely, 1023 10-bit symbols, thereby eliminating the problem of error cancellation associated with the above system for m=10. In addition, the EDC codewords can be accomplished in a byte-based system with the addition of minimal hardware elements.

Having disclosed exemplary embodiments and the best mode, modifications and variations may be made to the disclosed embodiments while remaining within the scope of the invention as defined by the following claims.

What is claimed is:

1. A method for error correction and miscorrection detection in data transmission, the method comprising steps of:
    (a) receiving a data signal wherein the data signal includes user data appended with a first set of parity symbols to form a first codeword that is appended with a second set of parity symbols to form at least a second codeword, such that a symbol size of the first set of parity symbols is greater than a symbol size of the second set of parity symbols;
    (b) calculating syndrome signals from the first codeword;
    (c) receiving an error signal for each correction of the data signal;
    (d) adjusting the syndrome signals in response to the received error signals; and
    (e) determining if a miscorrection has occurred based on the adjusted syndrome signals.

2. The method of claim 1 wherein:
the step (b) further includes steps of:
    (b)(ii) generating a first set of syndrome signals from the user data appended with the plurality of n-bit EDC parity-symbols,
    (b)(iii) generating a second set of syndromes signals from the n-bit leftover symbol(s), and
    (b)(iv) combining the first set of syndrome signals with the second set of syndrome signals to form the plurality of EDC syndrome signs;
the step (d) further includes a step of:
    (d)(i) removing an error contribution from each of the plurality of EDC syndrome signals using each error signal; and
the step (e) further includes steps of:
    (e)(i): determining whether the plurality of EDC syndrome signals are equal to 0 as a result of the removing step, and
    (e)(ii) when the plurality of EDC syndrome signals are not equal to 0 because a miscorrection has occurred, reporting uncorrectable data.

3. The method of claim 2, wherein:
the step (a)(i) further includes a step of:
    1) using as the plurality of m-bit EDC parity-symbols $2T_{EDC}$ m-bit EDC parity-symbols, wherein $T_{EDC}$ is a natural number representing an error correcting ability of the EDC:
the step (a)(ii) further includes steps of:
    1) using as the plurality of n-bit EDC parity-symbols $2T_{EDC}$ n-bit partial parity-symbols, comprised of an n-least significant bits (LSB) of each of the $2T_{EDC}$ m-bit EDC parity symbols, and
    2) using as the n-bit leftover-symbol(s) an (m–n)-most significant bits (MSB) of each of the $2T_{EDC}$ m-bit EDC parity symbols;
the step (a) further includes a step of:
    (a)(iv) using as the first codeword an EDC codeword, comprised of the user data appended with the $2T_{EDC}$ n-bit partial parity-symbols and appended with the n-bit leftover-symbol(s);
the step (b)(ii) further includes steps of:
    1) forming the EDC codeword from the data signal,
    2) forming a LSB EDC polynomial codeword L(X) by representing the user data appended with the $2T_{EDC}$ n-bit partial parity-symbols as coefficient values of L(X),
    3) evaluating L(X) at $2T_{EDC}$ consecutive powers of a primitive root a beginning with $\alpha^{m0}$ to form $2T_{EDC}$ LSB EDC syndrome signals, wherein $m_0$ is a an arbitrary integer;
the step (b)(iii) includes steps of:
    1) generating $2T_{EDC}$ MSB m-bit parity symbols by padding each of the (m–n)-MSB contained within the n-bit leftover symbol(s) with n-zeros represented as coefficients of a MSB EDC codeword polynomial H(X),
    2) evaluating H(X) at $2T_{EDC}$ consecutive powers of the primitive root a beginning with $\alpha^{m0}$ to form $2T_{EDC}$ leftover syndrome signals; and
the step (b)(iv) further includes a step of:
    1) combining the $2T_{EDC}$ leftover syndrome signals with the $2T_{EDC}$ EDC LSB syndrome signals to form the $2T_{EDC}$ EDC syndrome signals.

4. The method of claim 3, wherein each of the error signals is comprised of a forward error location (FEL) signal and an error value (EV) signal and the step d(i) further includes steps of
  1) determining an error location (K) within the EDC codeword from the FEL signal;
  2) calculating $2T_{EDC}$ EDC error signals by multiplying the EV signal by $2T_{EDC}$ consecutive powers of a Kth power of the primitive root α beginning with $α^{m0}$ ($α^{m0k}$) for each of the $2T_{EDC}$ EDC syndrome signals;
  3) subtracting each EDC error signal from a respective one of the $2T_{EDC}$ EDC syndrome signals; and
  4) repeating steps 1 through 3 until a completion signal is received.

5. The method of claim 4, wherein:
the step (a) further includes steps of;
  (a)(v) using as the second set of parity symbols a plurality of n-bit error correction code (ECC) parity symbols,
  (a)(vi) using as the EDC a Reed Solomon (RS) EDC created with a Galois Field of order $2^m$ ($GF(2^m)$), and
  (a)(vii) using as the ECC a RS ECC created with a GF of order $2^n$ ($GF(2^n)$),
  (a)(viii) wherein m=10,
  (a)(ix) wherein n=8, and
  (a)(x) wherein $T_{EDC}$=2;
the step (b) further includes steps of:
  (b)(v) using as the primitive root α an element of a GF of order $2^m$,
  (b)(vi) wherein m=10,
  (b)(vii) wherein n=8, and
  (b)(viii) wherein $T_{EDC}$=2; and
the step (d)(i) further includes steps of:
  5) using as the primitive root α an element of a GF of order $2^m$, and
  6) wherein $T_{EDC}$=2.

6. The method of claim 1, wherein before the step (a), the user data is encoding by the following steps:
  (a)(i) generating the first set of parity symbols as $2T_{EDC}$, m-bit error detection code (EDC) parity symbols from the user data using a Linear Block Code (LBC), such that the symbol size of the first of parity symbols is m-bits and $T_{EDC}$ is a natural number representing an error correction capability of the EDC;
  (a)(ii) forming $2T_{EDC}$ n-bit partial parity-symbols from an n-least significant bits (LSB) of each of the $2T_{EDC}$ m-bit parity symbols, such that a symbols size of the $2T_{EDC}$ n-bit partial parity-symbols is n-bits;
  (a)(iii) forming at least one n-bit leftover-symbol from a (m−n)-most significant bits (MSB) of each of the $2T_{EDC}$ m-bit parity symbols;
  (a)(iv) appending the $2T_{EDC}$ n-bit partial parity symbols followed by the leftover-symbol(s) to the user data such that an EDC codeword is formed;
  (a)(v) interleaving the EDC codeword to form a plurality of interleaves;
  (a)(vi) generating the second set of parity symbols as $2T_{EDC}$ n-bit error correction code (ECC) parity symbols for each interleave using the LBC, such that the symbol size of the second set of parity symbols is n-bits and $T_{ECC}$ is a natural number representing the error correction capability of the ECC;
  (a)(vii) appending each interleave with the $2T_{ECC}$ ECC parity symbols to form the data signal; and
  (a)(viii) writing the data signal to a data storage device.

7. The method of claim 6 wherein:
the step (a) further includes steps of:
  (a)(ix) using as the EDC a Reed Solomon (RS) EDC created with a Galois Field of order $2^m$ ($GP(2^m)$),
  (a)(x) using as the ECC a RS ECC created with a GF of order $2^n$ ($GF(2^n)$),
  (a)(xi) wherein m=10,
  (a)(xii) wherein n=8,
  (a)(xiii) wherein $T_{EDC}$=2, and
  (a)(xiv) wherein $T_{EDC}$=5.

8. The method of claim 1 wherein:
the step (a) further includes steps of:
  (a)(i) using as the syndrome signals $2T_{EDC}$ syndrome signals, wherein $T_{EDC}$ is a natural number representing an error correcting ability of the EDC,
  (a)(ii) using as the plurality of m-bit EDC parity symbols $2T_{EDC}$ m-bit EDC parity symbols,
  (a)(iii) using as the plurality of n-bit EDC parity-symbols $2T_{EDC}$ n-bit partial parity-symbols, comprised of an n-least significant bits (LSB) of each of the $2T_{EDC}$ m-bit EDC parity symbols,
  (a)(iv) using as the n-bit leftover-symbol(s) an (m−n)-most significant bits (MSB) of each of the $2T_{EDC}$ m-bit EDC parity symbols,
  (a)(v) using as the first codeword an EDC codeword, comprised of the user data appended with the $2T_{EDC}$ n-bit partial parity-symbols and appended with the n-bit leftover-symbol(s); and
the step (b) further includes steps of;
  (b)(i) forming the EDC codeword from the data signal,
  (b)(ii) forming a LSB EDC polynomial codeword L(X) by representing the user data appended the $2T_{EDC}$ n-bit partial parity symbols as coefficient values of L(X),
  (b)(iii) evaluating L(X) at $2T_{EDC}$ consecutive powers of a primitive root α beginning with $α^{m0}$ to form $2T_{EDC}$ LSB EDC syndrome signals, wherein $m_0$ is a an arbitrary integer,
  (b)(iv) generating $2T_{EDC}$ MSB m-bit parity symbols by padding each of the (m−n)-MSB contained within the n-bit leftover symbol(s) with n-zeros represented as coefficient values of a MSB EDC codeword polynomial H(X),
  (b)(v) evaluating H(X) at $2T_{EDC}$ consecutive powers of the primitive root α beginning with $α^{m0}$ to form $2T_{EDC}$ leftover syndrome signals,
  (b)(vi) Combining the $2T_{EDC}$ leftover syndrome signals with the $2T_{EDC}$ EDC LSB syndrome signals to form the $2T_{EDC}$ EDC syndrome signals.

9. The method of claim 8, wherein:
the step (a) further includes steps of:
  (a)(ix) using as the second set of parity symbols a plurality of n-bit error correction code (ECC) parity symbols,
  (a)(x) using as the EDC a Reed Solomon (RS) EDC created with a Galois Field of order $2^m$ ($GF(2^m)$),
  (a)(xi) using as the ECC a RS ECC created with a GF of order $2^n$ ($GF(2^n)$)
  (a)(xii) wherein m=10,
  (a)(xiii) wherein n=8, and
  (a)(xiv) using wherein $T_{EDC}$=2;
the step (a) further includes steps of:
  (b)(vii) using as the primitive root α an element of a GF of order $2^m$,
  (b)(viii) wherein $m_0$=1,
  (b)(ix) wherein m−10,
  b(x) wherein n=8, and
  (b)(xi) wherein $T_{EDC}$=2.

10. The method of claim 1, wherein:
the step (a) further includes steps of,
  (a)(i) using as the first codeword an error detection code (EDC) codeword;
  (a)(ii) using as the syndrome signals $2T_{EDC}$ EDC syndrome signals, wherein $T_{EDC}$ is a natural number representing an error correcting ability of the EDC;

(a)(iii) using as the error signals a forward error location (FEL) signal and an error value (EV) signal;
the step (d) further includes steps of:
- (d)(i) determining an error location (K) within the EDC codeword from the FEL signal,
- (d)(ii) calculating $2T_{EDC}$ EDC error signals by multiplying the EV signal by $2T_{EDC}$ consecutive powers of a Kth power of a primitive root α beginning with $α^{m0}$ ($α^{m0k}$) for each of the $2T_{EDC}$ EDC syndrome signals,
- (d)(iii) subtracting each EDC error signal from a respective one of the $2T_{EDC}$ EDC syndrome signal, and
- (d)(iv) repeating steps (d)(i) through (d)(iii) until a completion signal is received; and the step (e) further includes steps of:
- (e)(i) determining a value of the $2T_{EDC}$ EDC syndrome signals once each of the $2T_{EDC}$ EDC error signals are removed, and
- (e)(ii) when the $2T_{EDC}$ EDC syndrome signals are not equal to 0 because a miscorrection has occurred, reporting uncorrectable data.

11. The method of claim 10, wherein:
the step (a) further includes steps of:
- (a)(iv) using as the second set of parity symbols a plurality of n-bit error correction code (ECC) parity symbols,
- (a)(v) using as the EDC a Reed Solomon (RS) EDC created with a Galois Field of order $2^m$ ($GF(2^m)$),
- (a)(vi) using as the ECC a RS ECC created with a GF of order $2^n$ ($GF(2^n)$)
- (a)(vii) wherein r=10,
- (a)(viii) wherein n=8, and
- (a)(ix) wherein $T_{EDC}$=2 and the step (d) further includes steps of:
- (d)(v) using as the primitive root a an element of a Galois Field of order $2^m$,
- (d)(vi) wherein m=10,
- (d)(vii) wherein n=8, and
- (d)(viii) wherein $T_{EDC}$=2.

12. A method for error correction and miscorrection detection in data transmission using a Linear Block Code (LBC), the method comprising steps of:
a) generating $2T_{EDC}$ m-bit error detection code (EDC) parity symbols from the user data using a linear Block Code (LBC), such that TEDC is a natural number representing an error correction capability of the EDC;
b) forming $2T_{EDC}$ n-bit partial parity-symbols from an n-least significant bits (LSB) of each of the $2T_{EDC}$ m-bit parity symbols;
c) forming at least one n-bit leftover-symbol from a (m−n)-most significant bits (MSB) of each of the $2T_{EDC}$ m-bit parity symbols;
d) appending the $2T_{EDC}$ n-bit partial parity symbols followed by the leftover-symbol(s) to the user data as coefficients of the EDC codeword polynomial C(x);
e) interleaving the EDC codeword C(x) to form a plurality of interleaves;
f) generating $2T_{ECC}$ n-bit error correction code (ECC) parity symbols for each interleave using the LBC, wherein $T_{ECC}$ is a natural number representing the error correction capability of the ECC;
g) appending each interleave with the $2T_{ECC}$ ECC parity symbols to form a data signal;
h) writing the data signal to a data storage device;
i) reading the data signal from the data storage device;
j) forming a received EDC codeword polynomial R(X) from the data signals, such that R(x)=C(x) if R(x) is not corrupted during read back from the data storage device;
k) forming a LSB EDC codeword polynomial L(X) such that the used data and the $2T_{EDC}$ n-bit partial parity-symbols are coefficient values of L(X);
l) evaluating L(X) at $2T_{EDC}$ consecutive powers of a primitive root α beginning with $α^{m0}$ to form $2T_{EDC}$ LSB EDC syndrome signals, wherein $m_0$ is a an arbitrary integer;
m) generating $2T_{EDC}$ CMSG m-bit parity symbols by padding each of the (m−n)-MSB contained within the n-bit leftover symbol(s) with n-zeros to from a MSB EDC codeword polynomial H(X);
n) evaluating H(X) at $2T_{EDC}$ consecutive powers of the primitive root α beginning with $αm^{m0}$ to form the $2T_{EDC}$ leftover syndrome signals;
o) combining the $2T_{EDC}$ leftover syndrome signals with the $2T_{EDC}$ EDC LSB syndrome signals to form $2T_{EDC}$ EDC syndrome signals;
p) receiving a forward error location (FEL) signal and an error value (EV) signal for each data corruption of the coded data signal detected by an error cordon unit;
q) determining an error location (K) within the EDC codeword from the FEL signal;
r) calculating $2T_{EDC}$ EDC error signals by multiplying the EV signal by $2T_{EDC}$ consecutive powers of a Kth power of the primitive root α beginning with $α^{m0}$ ($α^{m0k}$) for each of the $2T_{EDC}$ EDC syndromesignals;
s) subtracting each EDC error signal from a respective one of the $2T_{EDC}$ EDC syndrome signal;
t) repeating steps p) through s) until a signal is received;
u) determining whether the $2T_{EDC}$ EDC syndrome signal are equal to 0 as a result of the subtracting step; and
v) when the $2T_{EDC}$ EDC syndrome signals are not equal to 0 because a miscorrection has occurred, reporting uncorrectable data.

13. The method of claim 12, further including steps of:
(w) using as the EDC a Reed Solomon (RS) EDC created with a Galois Field of order $2^m$ ($GF(2^m)$),
(x) using as the ECC a RS ECC created with a GF of order $2^n$ ($GF(2^n)$,
(y) wherein m=10,
(z) using as the wherein n=8,
(aa) wherein $T_{EDC}$=2,
(ab) using as the primitive root α an element of a Galois Field of order $2^m$, and
(ac) wherein $T_{ECC}$=5.

14. An error correction and miscorrection detection in data transmission apparatus, the apparatus comprising:
a memory buffer for storing user data contained within the data signal, the data signal includes the user data appended with a first set of parity symbols to form a first codeword that is appended with a second set of parity symbols to form at least a second codeword, such that a symbol size of the first set of parity symbols is greater than a symbol size of the second set of parity symbols;
a syndrome computer circuit configured to receive the first codeword and compute syndrome signals from the first codeword;

an error correction circuit configured to receive the data signal, generate an error signal for each detection of a data corruption of the data signal, correct the user data contained In the memory unit with each error signal and generate a completion signal once correction of the user data is complete; and an EDC syndrome fix-up circuit configured to receive the syndrome signals, each of the error signals and the completion signal, and adjust the syndrome signals in response to the received error signals and determine if a miscorrection has occurred based on a value of the adjusted syndromes once the completion signal is received.

15. The apparatus of claim 14, wherein:

the first set of parity symbols comprises of a plurality of m-bit error detection code (EDC) parity symbols, such that the symbol size of the first set of parity symbols is m-bits and the EDC parity symbols are comprised of a plurality of n-bit EDC parity-symbols and at least one n-bit leftover symbol(s);

the second set of parity symbols comprises a plurality of n-bit error correction code (ECC) parity symbols, such that the symbol size of the second set of parity symbols is n-bits;

the syndrome signals are comprised of a plurality of EDC syndrome signals; and the first codeword is an EDC codeword.

16. The apparatus of claim 15, wherein the syndrome computer circuit is further configured to:

generate a first set of syndrome signals from the user data appended with the plurality of n-bit EDC parity-symbols;

generate a second set of syndrome signals from the n-bit leftover symbol(s); and combine the first set of syndrome signals with the second set of syndrome signals to form the plurality of EDC syndrome signals.

17. The apparatus of claim 16, wherein the syndrome computer circuit aid further comprises:

a syndrome input configured to receive data comprised of the EDC codeword;

$2T_{EDC}$ syndrome generator circuits configured to receive the data in parallel from the syndrome input and compute the first set of syndrome signals as $2T_{EDC}$ least significant bit (LSB) EDC syndromes syndrome signals from the user data appended with the plurality of n-bit parity symbols, the user data and the plurality of n-bit EDC parity symbols represented as coefficient values of a polynomial L(X), wherein the plurality of n-bit EDC parity-symbols are comprised of an n-LSBs of each of the plurality of m-bit EDC parity symbols and $T_{EDC}$ is a natural number representing an error correction capability of the EDC, comprised of a memory unit for storing each of the $2T_{EDC}$ LSB EDC syndrome signals, $2T_{EDC}$ GF multipliers each coupled to one of the memory unit and configured to multiply a Jth power of a primitive root $\alpha$ ($\alpha^J$) by a value contained with the memory unit (R) to generate $R*\alpha^J$, wherein the J varies and is distinct for each of the GF multipliers between $m_0$ and $m_0+T_{EDC}-1$ and $m_0$ is a an arbitrary integer, and $2T_{EDC}$ Galois Field (GF) adders each coupled to one of the $2T_{EDC}$ multipliers and the syndrome input and configured to add the data received from the syndrome input by the $R*\alpha^J$ to produce a root sum and store the toot sum in the memory unit, such that after the user data and the plurality of n-bit parity-symbols are received, a Jth LSB EDC syndrome $L(\alpha^J)$ is stored in the memory unit; and $2T_{EDC}$ leftover circuits, each coupled to one of the $2T_{EDC}$ syndrome generator circuits and configured to receive the n-bit leftover-symbol(s) from the syndrome input, compute the second set of syndrome signals as $2T_{EDC}$ most significant bit (MSB) EDC syndrome signals from the leftover-symbol(s) for each of the $2T_{EDC}$ LSB EDC syndrome signals and combine each of the MSB EDC syndrome signal with a corresponding one of the $2T_{EDC}$ LSB EDC syndrome signals at a leftover circuit output, each stored in a corresponding one of the memory units to form the plurality of EDC syndrome signals as $2T_{EDC}$ EDC syndrome signals, wherein the n-bit leftover-symbol(s) are comprised of (m−n)-MSBs of each of the plurality of m-bit EDC parity symbols.

18. The apparatus of claim 17, wherein the $2T_{EDC}$ EDC syndrome Signals are formed during a decoding state, further including:

an EDC encoder, configured to receive the user data from an encoder input during an encoding state, and generate the plurality of EDC m-bit parity symbols as $2T_{EDC}$ EDC m-bit parity symbols from the user data using a Linear Block Code (LBC) and supply the $2T_{EDC}$ EDC m-bit parity symbols to an output parity bus;

a MSB parity memory unit coupled to the output parity bus and configured to receive the (m−n)-MSB of each of the $2T_{EDC}$ m-bit EDC parity symbols to form the n-bit leftover symbol(s), such that an n-LSB of each of the $2T_{EDC}$ m-bit EDC parity symbols remain on the output parity bus to form the plurality of n-bit EDC parity-symbols as $2T_{EDC}$ n-bit partial parity-symbols that are appended to the user data along with the leftover symbol(s) to form the EDC codeword as an encoder output, the encoding state and the decoding state determined by a control unit; and an ECC encoder/interleaver coupled to the encoder output and configured to receive the EDC codeword during the encoding stage, interleave the EDC codeword to form a plurality of interleaves, generate the plurality of n-bit ECC parity symbols as $2T_{ECC}$ n-bit ECC parity symbols for each interleave using the LBC, such that $T_{ECC}$ is natural number representing the error correction capability of the ECC, and appending each of the interleaves with the $2T_{EDC}$ n-bit ECC parity symbols to form the data signal that is then written to a data storage media.

19. The apparatus of claim 18, wherein the EDC is a Reed Solomon (RS) EDC created with a Galois Field of order $2^m$ (GF($2^m$)), the ECC is a RS ECC created with a GF of order $2^n$ (GF($2^n$)), the primitive root $\alpha$ is an element of the GF($2^m$), the m=10, the n=8, the $T_{EDC}=2$, the $T_{ECC}=5$, each of the leftover circuits further includes:

a padder configured to receive the n-bit leftover symbol(s) as a leftover-byte from the encoder/syndrome input and generate 4 MSB 10-bit parity symbols H3, H2, H1 and H0) by padding each of the (m−n)-MSB contained within the leftover byte with 8-zeros;

3-leftover multipliers for multiplying $H3*\alpha^{3J}$, $H2*\alpha^{2J}$ and $H1*\alpha^J$;

a leftover GF adder configured to combine $H3*\alpha^{3J}+H2*\alpha^{2J}+H1*\alpha+H0$ to from a MSB syndrome $H(\alpha^J)$;

a syndrome adder configured to combine $H(\alpha^J)$ and $L(\alpha^J)$ at a syndrome output; and $2T_{EDC}$ multiplexer gates having a first state wherein a sum output of one of the $2T_{EDC}$ GF adders is transferred to one of the memory units as a multiplexer output and a second state wherein the leftover circuit output of one of the $2T_{EDC}$ leftover circuits is transferred to one of the memory units as the multiplier output to form one of the $2T_{EDC}$ EDC syndrome signals $R(\alpha^j)$ and store the $R(\alpha^j)$ in the memory unit;

an output parity gate having a first state wherein the $2T_{EDC}$ n-bit partial parity symbols on the output parity bus are transferred as a parity output and a second state wherein the n-bit leftover symbol(s) contained in the MSB-bit parity memory unit are transferred as the parity output; and a data control unit configured to control the states of the gates such that
  (a) during the encoding state the $2T_{EDC}$ multiplexer gates and the output parity gate are in the first state until the user data and the $2T_{EDC}$ n-bit partial parity symbols are transferred as the parity output to the encoder output, wherein the output parity gate switches to the second state such that the n-bit leftover-symbol(s) are transferred as the parity output to the encoder output, and
  (b) during the decoding state of the $2T_{EDC}$ multiplier gates are in the first state until the n-bit leftover symbol(s) are received by the syndrome input wherein the $2T_{EDC}$ multiplier gates switch to the second state such that the leftover circuit output of each of the $2T_{EDC}$ leftover circuits is transferred as the multiplier output of each of the $2T_{EDC}$ multiplier gates and stored in the memory units to form the $2T_{EDC}$ EDC syndrome signals.

20. The apparatus of claim 18, further including an ECC encoder/interleaver coupled to the encoder/syndrome output and configured to receive the EDC codeword during the encoding stage, interleave the EDC codeword to form a plurality of interleaves, generate the plurality of n-bit ECC parity symbols as $2T_{ECC}$ n-bit ECC parity symbols for each Interleave using the LBC, such that $T_{ECC}$ is a natural number representing the error correction capability of the ECC, and appending each of the interleaves with the $2T_{ECC}$ ECC parity symbols to for the data signal that is then written to a data storage media.

21. The apparatus of claim 17, wherein the syndrome computer circuit is an EDC encoder/syndrome computer circuit, such that the $2T_{EDC}$ EDC syndrome signals are formed during a decoding state and the plurality of m-bit EDC parity symbols are formed as $2T_{EDC}$ m-bit EDC parity symbols during an encoding state, the syndrome input is an encoder/syndrome input and the data is comprised of the user data during the encoding state and the EDC codeword during the decoding state, further comprising:

a parity circuit having an enabled state and a disabled state wherein the parity circuit is in the disabled state during the decoding state and in the enabled state during the encoding state to enable generation of the $2T_{EDC}$ m-bit EDC parity symbols and supply the $2T_{EDC}$ m-bit EDC parity symbols to an output parity bus, comprised of a parity GF adder coupled between $2T_{EDC}-1$ of each of the $2T_{EDC}$ GF multipliers and $2T_{EDC}-1$ of each of the $2T_{EDC}$ GF adders, and a gate coupled between each of the binary adders and an output of each of the $2T_{EDC}$ syndrome generator circuits, configured to switch to an enabled state during the encoding state and connect each of the $2T_{EDC}$ syndrome generator circuits with the output parity bus and switch to a disabled state during the decoding state and disconnect the $2T_{EDC}$ syndrome generators from the output parity bus; and a MSB parity memory unit coupled to the output parity bus and configured to receive the (m−n)-MSB of each of the $2T_{EDC}$ m-bit EDC parity symbols remain on the output parity bus to form the plurality of n-bit EDC parity-symbols as $2T_{EDC}$ n-bit partial panty-symbols that are appended to the user data along with the n-bit leftover symbol(s) to form the EDC codeword at an encoder/syndrome output, the encoding state and the decoding state determined by the control unit.

22. The apparatus of claim 21, wherein the EDC encoder/syndrome computer circuit further comprises:

an input data gate having a first state wherein the data received by the encoder/syndrome input is transferred as a data output and a second state wherein the $2T_{EDC}$ m-bit parity symbols supplied to the output parity bus are transferred as the data output, such that the data output of the input data gate is provided in parallel to each of the $2T_{EDC}$ syndrome generator circuits and the $2T_{EDC}$ leftover circuits;

$2T_{EDC}$ multiplexer gates having a first state wherein the sum output of one of the $2T_{EDC}$ GF adders is transferred to one of the memory units as a multiplexer output and a second state wherein the leftover circuit output and one of the $2T_{EDC}$ leftover circuits is transferred to one of the memory units as the multiplier output;

an output parity gate having a first state wherein the $2T_{EDC}$ n-bit partial parity symbols on the output parity bus are transferred as a parity output and a second state wherein the n-bit leftover symbol(s) contained in the MSB-bit parity memory unity are transferred as the parity output;

an output data gate having a first state wherein the data is contained on a feed-forward bus coupled to the encoder/syndrome input and transferred as an output to the encoder/syndrome output and a second state wherein the parity output of the output parity gate is transferred as the output to the encoder/syndrome output; and a data control unit configured to control the states of the gates such that
  (a) during the encoding state the parity circuit is in the enabled state, the input data gate, the $2T_{EDC}$ multiplexer gates, the output parity gate and the output data gate are in the first state until the data received by the encoder/syndrome input is completely transferred as the data output of the input data gate and as the output of the output data gate to the encoder/syndrome output, wherein the input data gate and the output data gate switch to the second state such that the $2T_{EDC}$ n-bit EDC parity-symbols are transferred as the output of the output data gate to the encoder/syndrome output, and wherein the output parity gate switches to the second state such that the n-bit leftover-symbol(s) are transferred as the output of the output data gate to the encoder/syndrome output, and
  (b) during the decoding state the parity circuit is in the disabled state, the input data gate, and the $2T_{EDC}$ multiplexer gates are in the first state until the n-bit leftover symbol(s) are received by the encoder/ syndrome input wherein the $2T_{EDC}$ multiplier gates switch to the second state such that the leftover circuit output of each of the $2T_{EDC}$ leftover circuits is transferred as the multiplexer output of each of the $2T_{EDC}$ multiplexer gates and stored in the memory units to form the $2T_{EDC}$ EDC syndrome signals.

23. The apparatus of claim 22, wherein the EDC is a Reed Solomon (RS) EDC created with a Galois field of order $2^m$ (GP($2^m$)), the ECC is a RS ECC created with a GP of order $2^n$ (GF($2^n$)), the primitive root $\alpha$ is an element of the GF($2^m$), $m_0$=J, the m=10, the n=8, the $T_{EDC}$=2 and each of the leftover circuits further comprises:

a padder configured to receive the n-bit leftover symbol(s) as a leftover-byte from the encoder/syndrome input and generate 4 MSB 10-bit parity symbols (H3, H2, H1 and H0) by padding each of the (m−n)-MSB contained within the leftover-byte with eight zeros;

Three leftover multipliers for multiplying $H3*\alpha^{3J}$, $H2*\alpha^{2J}$, and $H1*\alpha^{J}$;

a leftover GF adder configured to combine $H3*\alpha^{3J}+H2*\alpha^{2J}+H1*\alpha^{J}+H0$ to form a MSB syndrome $H(\alpha^J)$; and a syndrome adder configured to combine $H(\alpha^J)$ and $L(\alpha^J)$ at a syndrome output and form one of the $2T_{EDC}$ EDC syndrome signals as $R(\alpha^J)$ and store the $R(\alpha^J)$ in the memory unit.

24. The apparatus of claim 16, wherein the plurality of EDC syndrome signals are $2T_{EDC}$ EDC syndrome signals and $T_{EDC}$ is a natural number representing an error correction capability of the EDC and each of the error signals is comprised of a forward error location (FEL) signal and an error value (EV) signal, the EDC syndrome fix-up circuit further includes:

a first adder/subtractor configured to subtract a number (N) representing the amount of bytes of the user data plus $2T_{EDC}-1$ from the FEL signal to form a value (K) representing an error position within the EDC codeword;

a first anti-logarithmic circuit configured to compute a Kth power of a primitive root $\alpha$ ($\alpha^K$);

a second anti-logarithmic circuit configured to compute a Kth power of a beginning with $\alpha^{m0}$ ($\alpha^{m0K}$), wherein $m_0$ is an arbitrary integer;

a second GF multiplier configured to multiply $\alpha^{m0K}$ by the EV signal to generate $EV*\alpha^{m0K}$, wherein $EV*\alpha^{m0K}$ is one of the EDC error contribution signals corresponding to one of the $2T_{EDC}$ EDC syndrome signals generated by $R(\alpha^{m0})$;

an error elimination circuit configured to generate $2T_{EDC}-1$ EDC error contribution signals beginning with $EV*\alpha^{(m0+1)K}$ corresponding to one of the $2T_{EDC}$ EDC syndrome signals generated by $R(\alpha^{(m0+1)})$ and removing the $EV*\alpha^{(m0+1)K}$ from the $R(\alpha^{(m0+1)})$ and ending with $EV*\alpha^{(m0+2TEDC+1)K}$ corresponding to one of the $2T_{EDC}$ EDC syndrome signals generated by $R(\alpha^{(m0+2TEDC-1)})$ and removing the $EV*\alpha^{(m0+2TEDC-1)K}$ from the $R(\alpha^{(m0+2TEDC-1)})$; and a comparator configured to receive and evaluate each of the $2T_{EDC}$ EDC syndrome signals and determine the value and generate the value signal.

25. The apparatus of claim 24, wherein the second set of party symbols comprises a plurality of n-bit error correction code (ECC) parity symbols;

the EDC is a Reed Solomon (RS) EDC created with a Galois field of order $2^m$ (GF($2^m$)), the ECC is a RS ECC created with a GF of order $2^n$ (GF($2^n$)) and the primitive root ac is an element of the GF($2^m$) and;

the m=10;

the n=8; and the $T_{EDC}$=2.

26. The apparatus of claim 14, wherein the first set of parity symbols comprises of a plurality of m-bit error detection code (EDC) parity symbols, such that the symbol size of the first set of parity symbols is m-bits;

wherein the second set of parity symbols comprises a plurality of n-bit error correction code (ECC) parity symbols, such that the symbol size of the second set of parity symbols is n-bits;

the syndrome signals are comprised of a plurality of EDC syndrome signals;

wherein the first codeword is an EDC codeword; and wherein the plurality of EDC syndrome signals are $2T_{EDC}$ EDC syndrome signals and $T_{EDC}$ is a natural number representing an error correction capability of the EDC and each of the error signals is comprised of a forward error location (FEL) signal and an error value (EV) signal, the EDC syndrome fix-up circuit further includes:

a first adder/subtractor configured to subtract a number (N) representing the amount of bytes of the user data plus $2T_{EDC}-1$ from the FEL signal to form a value (K) representing an error position within the EDC codeword;

a first anti-logarithmic circuit configured to compute a Kth power of a primitive root $\alpha$ ($\alpha^K$);

a second anti-logarithmic circuit configured to compute a Kth power of a beginning with $\alpha^{m0}$ ($\alpha^{m0K}$), wherein m0 is an arbitrary integer;

a second GF multiplier configured to multiply $\alpha^{m0K}$ by the EV signal to generate $EV*\alpha^{m0K}$, wherein $EV*\alpha^{m0K}$ is one of the EDC error contribution signals corresponding to one of the $2T_{EDC}$ EDC syndrome signals generated by $R(\alpha^{m0})$;

an error elimination circuit configured to generate $2T_{EDC}-1$ EDC error contribution signals beginning with $EV*\alpha^{(m0+1)K}$ corresponding to one of the $2T_{EDC}$ EDC syndrome signals generated by $R(\alpha^{(m0+1)})$ and removing the $EV*\alpha^{(m0+1)K}$ from the $R(\alpha^{(m+1)})$ and ending with $EV*\alpha^{(m0+2TEDC-1)K}$ corresponding to one of the $2T_{EDC}$ EDC syndrome signals generated by $R(\alpha^{(m0+2TEDC-1)})$ and removing the $EV*\alpha^{(m0+2TEDC-1)K}$ from the $R(\alpha^{(m0+2TEDC-1)})$; and a comparator configured to receive and evaluate each of the $2T_{EDC}$ EDC syndrome signals and determine the value and generate signal.

* * * * *